United States Patent
Kim et al.

(10) Patent No.: US 9,576,235 B2
(45) Date of Patent: Feb. 21, 2017

(54) CARD-TYPE WIRELESS TRANSCEIVER FOR A VEHICLE, AND METHOD FOR MANUFACTURING SAME

(71) Applicant: Continental Automotive Systems Corporation, Icheon-si (KR)

(72) Inventors: Cheolsoo Kim, Gwangju-si (KR); Kyungho Woo, Icheon-si (KR); Kilnam Kim, Gyeonggi-do (KR); Houngsik Jeong, Suwon-si (KR); Sungmin Jang, Icheon-si (KR)

(73) Assignee: CONTINENTAL AUTOMOTIVE SYSTEMS CORPORATION (KR)

( * ) Notice: Subject to any disclaimer, the term of this patent is extended or adjusted under 35 U.S.C. 154(b) by 25 days.

(21) Appl. No.: 14/363,711

(22) PCT Filed: Dec. 7, 2012

(86) PCT No.: PCT/KR2012/010607
§ 371 (c)(1),
(2) Date: Feb. 2, 2015

(87) PCT Pub. No.: WO2013/085329
PCT Pub. Date: Jun. 13, 2013

(65) Prior Publication Data
US 2015/0161500 A1 Jun. 11, 2015

(30) Foreign Application Priority Data

Dec. 7, 2011 (KR) .................. 10-2011-0130612
Dec. 7, 2011 (KR) .................. 10-2011-0130613
(Continued)

(51) Int. Cl.
*G06K 19/06* (2006.01)
*G06K 19/077* (2006.01)
(Continued)

(52) U.S. Cl.
CPC ......... *G06K 19/07737* (2013.01); *B60R 25/10* (2013.01); *G06K 19/07749* (2013.01);
(Continued)

(58) Field of Classification Search
CPC . G06K 7/00; G06K 19/07749; G06K 19/0775
(Continued)

(56) References Cited

U.S. PATENT DOCUMENTS 5,051,724 A 9/1991 Morrow et al. ........... 340/568.1
5,117,097 A * 5/1992 Kimura .................. B60R 25/04
235/439
(Continued)

FOREIGN PATENT DOCUMENTS

JP 2004134835 A 4/2004 ............ E05B 19/00
JP 2009-221767 10/2009
(Continued)

OTHER PUBLICATIONS

International Search Report and Written Opinion, Application No. PCT/KR2012/010607, 18 pages, Mar. 25, 2013.
(Continued)

*Primary Examiner* — Daniel St Cyr

(57) ABSTRACT

Disclosed is a wireless transceiver for a vehicle and a method of manufacturing the same. In a wireless transceiver manufacturing process according to the present disclosure and a method of manufacturing the same, both of the top and bottom sides of a circuit board, on which components are mounted, are encapsulated using a resin material in a state where the circuit board floats in a cavity. A pin configured to support the circuit board is installed and a decoration flat member is fixed to the surface of the circuit board opposite to the side where the pin is installed using double-sided tape. As a result, it is possible to prevent the resin case from being warped by heat generated from the circuit board. In addition,
(Continued)

it is possible to omit an existing post-processing process for preventing the damage to the circuit board which may be caused when one side of the circuit board is exposed to the outside as it is. Thus, steps of the manufacturing process and the manufacturing costs can be reduced.

20 Claims, 16 Drawing Sheets

(30) Foreign Application Priority Data

| Dec. 29, 2011 | (KR) | 10-2011-0146462 |
|---|---|---|
| Dec. 29, 2011 | (KR) | 10-2011-0146473 |
| Dec. 29, 2011 | (KR) | 10-2011-0146477 |
| Feb. 20, 2012 | (KR) | 10-2012-0017158 |
| Feb. 20, 2012 | (KR) | 10-2012-0017161 |
| Feb. 21, 2012 | (KR) | 10-2012-0017499 |
| Feb. 21, 2012 | (KR) | 10-2012-0017517 |
| Feb. 21, 2012 | (KR) | 10-2012-0017526 |
| Apr. 10, 2012 | (KR) | 10-2012-0037331 |
| Apr. 10, 2012 | (KR) | 10-2012-0037342 |
| Apr. 10, 2012 | (KR) | 10-2012-0037344 |
| Apr. 10, 2012 | (KR) | 10-2012-0037350 |
| Apr. 16, 2012 | (KR) | 10-2012-0039295 |
| Apr. 16, 2012 | (KR) | 10-2012-0039298 |
| Apr. 16, 2012 | (KR) | 10-2012-0039305 |
| Oct. 15, 2012 | (KR) | 10-2012-0114302 |

(51) Int. Cl.
| | |
|---|---|
| *H01Q 1/32* | (2006.01) |
| *H04B 1/3816* | (2015.01) |
| *H05K 3/28* | (2006.01) |
| *H01Q 7/08* | (2006.01) |
| *H01F 27/30* | (2006.01) |
| *H01F 41/06* | (2016.01) |
| *H05K 3/30* | (2006.01) |
| *H05K 3/38* | (2006.01) |
| *B60R 25/10* | (2013.01) |
| *H04B 1/3827* | (2015.01) |

(52) U.S. Cl.
CPC ............ *H01F 27/306* (2013.01); *H01F 41/06* (2013.01); *H01Q 1/3241* (2013.01); *H01Q 7/08* (2013.01); *H04B 1/3816* (2013.01); *H04B 1/3827* (2013.01); *H05K 3/284* (2013.01); *H05K 3/303* (2013.01); *H05K 3/381* (2013.01); *H05K 2201/10037* (2013.01); *H05K 2201/10098* (2013.01); *H05K 2203/1316* (2013.01); *H05K 2203/1327* (2013.01); *Y10T 29/49018* (2015.01); *Y10T 29/49146* (2015.01)

(58) Field of Classification Search
USPC .................................................. 235/492, 487
See application file for complete search history.

(56) References Cited

U.S. PATENT DOCUMENTS

| 7,664,471 | B2 | 2/2010 | Sugimoto et al. ........... 455/90.3 |
| 2006/0144683 | A1 | 7/2006 | White et al. |
| 2006/0245145 | A1 | 11/2006 | Wada et al. |
| 2006/0245170 | A1 | 11/2006 | Sugimoto et al. |
| 2006/0246851 | A1 | 11/2006 | Sugimoto et al. |
| 2009/0086447 | A1 | 4/2009 | Sutimoto et al. |

FOREIGN PATENT DOCUMENTS

| KR | 20060113443 A | 11/2006 | ............ E05B 49/00 |
| KR | 20080038313 A | 5/2008 | ............ B60R 25/20 |
| KR | 100848780 B1 | 7/2008 | ............ B29C 13/02 |
| WO | 2013/085329 A1 | 6/2013 | ............ B29C 35/02 |

OTHER PUBLICATIONS

Search Report dated Aug. 4, 2015, from corresponding EP Patent Application No. 12854568.8.

* cited by examiner

CARD-TYPE WIRELESS TRANSCEIVER FOR A VEHICLE, AND METHOD FOR MANUFACTURING SAME

BACKGROUND OF THE INVENTION

1. Field of the Invention

The present disclosure relates to a card type wireless transceiver for a vehicle and a method of manufacturing the same, and more particularly, to a method and an apparatus which are capable of simplifying a manufacturing process of a card type wireless transceiver and securing reliability for a product in order to implement the wireless transceiver for a vehicle in a thin film type.

2. Description of the Prior Art

A conventional wireless transceiver is a portable terminal which executes authentication for a driver and a vehicle through short-distance communication with an immobilizer installed inside the vehicle and, when the authenticated driver exists within a pre-set proper distance based on the authentication, controls driving of a plurality of electric components, including, for example, locking of a vehicle door lock.

However, when the driver gets out of the proper distance, the wireless transceiver controls the driving of the plurality of electric components including the locking of the vehicle door lock by the immobilizer in order to prevent theft and damage to the vehicle.

In addition, when the authenticated driver takes a seat inside the vehicle and then selects a separate engine start button installed inside the vehicle, the wireless transceiver starts the engine.

Such a wireless transceiver typically includes a battery configured to supply power, an emergency key configured to start an engine in an emergency situation, and a circuit board with electronic components embedded therein.

That is, in the conventional wireless transceiver for a vehicle, a circuit hoard, on which electronic components are mounted, is positioned within a molding die, and an epoxy-based thermoset resin material to encapsulate the circuit board in which the electronic components are mounted thereon. At this time, when the molding is performed in a state where the circuit board is attached to a bottom of the molding die, one side of the circuit board is exposed, so that a properly decorated external appearance cannot be provided. Due to this, a treatment process such as a surface painting treatment or a plating treatment is needed so as to form a beautiful appearance after encapsulating molding of the circuit board. Due to such a post treatment process, the defect rate of the entire process is high such that all the molded products may be discarded, which becomes the crucial factor of increasing the prices of entire products.

In addition, very small holes made of a conductive material are present within the circuit board in the thickness direction so as to electrically connect the layers of the circuit board. Since the holes are exposed to the outside as they are, the surface of the conductive material may be easily corroded, thereby causing malfunction of the circuit board.

When the side opposite to the component mounting surface of the circuit board is exposed to the outside, the component mounting surface is exposed to the outside and, thus, the circuit board is exposed to electricity as it is to cause damage to the circuit components. In addition, the exposure of the one side of the circuit board to the outside causes flexure of the body of the circuit board due to the difference between the thermal expansion coefficients of the circuit board and the resin sealant. Furthermore, when the circuit board is exposed as it is, there are difficulties in that it is necessary to perform additional processes such as machining for grinding the circuit board using a grinder and painting on the ground surface.

SUMMARY OF THE INVENTION

Accordingly, the present disclosure has been made in order to solve the above-mentioned problems and the present invention is to provide a card type wireless transceiver for a vehicle. The card type wireless transceiver includes: a circuit board which is embedded with a component; a battery accommodation member installed on one side of the circuit board, and including a battery terminal connected to the circuit board; and an emergency key accommodation device having a reinforce unit installed on the other side of the circuit board and connected to the circuit board through a soldering process. As a result, the thickness of the card type wireless transceiver can be minimized.

Another aspect of the present disclosure is to provide a method of manufacturing a card type wireless transceiver. The method includes: a first process of forming a circuit board embedded with a component, a battery accommodation member mounted on one side of the circuit board and including a battery terminal connected to the circuit board, a reinforcement unit mounted on the other side of the circuit board and connected with the circuit board through a soldering process, and an emergency key accommodation member having an emergency key that accommodates the accommodation slot; a second process of inserting an inserting block into each of a battery accommodation recess of the battery accommodation member and an emergency key accommodation slot of the emergency key accommodation member; a third process of installing previously patterned molding dies on top and bottom sides of the accommodation member, the emergency key accommodation member, and the circuit board so as to form cavities (air spaces) on top and rear sides of the circuit board with the molding dies; a fourth process of filling an epoxy-based resin in the cavities through a high-temperature and high-pressure press process so as to form a resin case configured to encapsulate the wireless transceiver; and a fifth process of removing the inserting blocks from the molding dies. As a result, the resin can be molded on the top and bottom sides of the circuit board, the circuit board can be supported using the support pin. Thus, it is possible to prevent the resin case from being warped by the heat generated from the circuit board. A post-process for repairing damaged portions of the circuit board can be omitted such that the number of manufacturing processes and the manufacturing costs can be basically reduced and the confidence in a product can be basically enhanced.

In accordance with an aspect of the present invention, provided is a card type wireless transceiver for a vehicle which is configured to execute authentication for a driver and a vehicle through short-distance communication with an immobilizer installed inside the vehicle and configured to control the vehicle based on a result of authentication. The transceiver includes: a circuit board which is embedded with a component configured to execute communication with the immobilizer; a battery accommodation member installed on one side of the circuit board, and including a battery terminal connected to the circuit board; and an emergency key accommodation device having a reinforce unit installed on the other side of the circuit board and connected to the circuit board through a soldering process, the emergency key accommodation device being inserted into a resin case which is molded using one resin component.

The emergency key accommodation device may include: an emergency key accommodation member housed within a body of a card type wireless transceiver to accommodate the emergency key; and a switching member installed at one side of the body to prevent removal of the emergency key accommodated in the emergency key accommodation member.

The emergency key and the emergency key accommodation member may be provided in a "⌐" shape.

The emergency key accommodation member may include: an emergency key accommodation slot provided in the body so that the emergency key is inserted into the emergency key accommodation slot; and the reinforcement unit configured to fix the emergency key to top, bottom, left and right walls of the emergency key accommodation slot, provided in the body.

The reinforcement, unit may be formed of a rigid stainless steel so as to protect the body from damage which is caused due to frequent removal and insertion operations of the emergency key.

The emergency key accommodation member may be fixedly installed through the soldering process on the one side of the circuit board fixedly installed inside the body of the card type wireless transceiver.

The switching member may be installed on one side of the emergency key accommodation member of the body and provided to prevent the insertion or removal of the emergency key in relation to the inside of the emergency key accommodation member according to the user's leftward or rightward moving manipulation state.

The switching member may include: a switch configured to allow the user to select the removal or insertion of the emergency key in relation to the inside of the emergency key accommodation member through the user's leftward or rightward manipulation; an elastic unit installed on one side of the switch to generate or restore elastic force depending on the leftward or rightward manipulation of the switch; and a latching step provided on the other side of the switch so as allow the emergency key to be accommodated in the reinforce unit when the emergency key is moved toward and accommodated in the emergency key accommodation member by the elastic force of the elastic unit, wherein the emergency key includes a latching recess which is provided on a position corresponding to the latching step and is fixedly latched to the latching step of the switching member so as to maintain the accommodated state of the emergency key.

In accordance with another aspect of the present invention, a method of manufacturing a card type wireless transceiver includes: a first process of forming a circuit board embedded with a component configured to perform data communication inside a vehicle, a battery accommodation member mounted on one side of the circuit board and including a battery terminal connected to the circuit board, a reinforcement unit mounted on the other side of the circuit board and connected with the circuit board through a soldering process, and an emergency key accommodation member having an emergency key that accommodates the accommodation slot; a second process of inserting an inserting block into each of a battery accommodation recess of the battery accommodation member and an emergency key accommodation slot of the emergency key accommodation member; a third process of installing previously patterned molding dies on top and bottom sides of the accommodation member, the emergency key accommodation member, and the circuit board so as to form cavities (air spaces) on top side and rear side of the circuit board with the molding dies; a fourth process of filling an epoxy-based resin in the cavities through a high-temperature and high-pressure press process so as to form a resin case configured to encapsulate the left, right, top and bottom surfaces of the wireless transceiver and then primarily curing the resin case; and a fifth process of removing the inserting blocks from the molding dies and then secondarily curing the resin case.

The first process may include: forming an antenna coil unit configured to data transmitted from the vehicle through LF communication on the circuit board, wherein a coil is wound around a bobbin and an output end and an input end of the coil are connected to corresponding pins of an micro control unit so as to perform data communication with the vehicle in X and Y directions; and forming an antenna pattern portion by etching a metallic copper foil layer of the circuit board in a predetermined pattern in order to transmit/receive data with the vehicle in a Z direction.

The forming of the antenna coil unit may include: winding the coil having a diameter which is equal to or less than a predetermined value on the bobbin which has a through-hole into which a rod-shaped core formed of a magnetic material; forming a connection portion extending along a longitudinal direction of the core from the bobbin and fixed to the bobbin and then connecting one terminal of the coil and the connection portion by soldering; fixedly installing a bottom surface of the bobbin around which the coil is wound and a bottom of the connection portion on predetermined positions on the circuit board through a soldering process and electrically connecting the coil to the circuit board through the connection portion; and forming a resonance circuit by connecting a capacitor to a predetermined position on the circuit board through a soldering process so that the capacitor and the coil are electrically connected with each other.

The antenna may be set to have a length in a range of 8.4 mm to 11.0 mm, a width in a range of 2.0 mm±0.03 mm, and a thickness of 1.3 mm.

The forming of the antenna coil unit further may include: forming a ceramic type crystal oscillator configured to generate clocks with a predetermined frequency.

In the forming of the antenna pattern portion, an adhesive may be coated on a front surface of a flexible film, the metallic copper foil is weld to be stacked, and then, the metallic copper foil may be etched on the circuit board, which has been subjected to a heat treatment and an exposure treatment, according to a predetermined pattern to form the antenna pattern portion.

The forming of the antenna pattern portion further may include: connecting a resistor, which is configured to detect a flow of a current so as to diagnose a defect, between an input terminal and an output terminal of the antenna pattern portion.

The first process may further include: forming an anchor hole in a remaining area other than a position where the component configured to receive data transmitted from the vehicle through LF communication, the anchor hole being larger than a via hole configured by a conductive material for electrical connection between circuit board layers.

The first process may further include: cleaning the circuit board so as to remove unnecessary solder from the circuit board after the component configured to perform communication with the vehicle is embedded through a soldering process.

The cleaning of the circuit board may include: removing unnecessary solder from the circuit board by inserting a plurality of circuit boards into recesses in a separate magazine and then immersing the magazine in a solvent contained in a container for a first predetermined length of time.

The cleaning of the circuit board may include: removing the solvent component by immersing the magazine in deionized water for a second predetermined length of time after the predetermined length of time has elapsed.

The cleaning of the circuit board may further include: removing the deionized water by separating each of the circuit boards from the magazine after the unnecessary solder and solvent is removed through the removing of the solvent and then, removing the deionized water under a pre-set high temperature for a three predetermined length of time.

In the removing of the deionized water, the deionized water may be removed by a high temperature of an oven.

The second step may further include: the cleaning of the circuit board may include: a first cleaning step of performing a plasma process based on a predetermined amount of hydrogen and a pre-set current to cause a chemical reaction between the hydrogen and an organic material so as to remove the organic material from a surface of a component on the circuit board.

The cleaning of the circuit board may include: a second cleaning step of performing a plasma process based on a predetermined amount of argon and a pre-set current so as to improve adhesion between the circuit board and the resin in the fourth process.

The cleaning of the circuit board may include: a tertiary cleaning step of performing a plasma process based on a predetermined amount of nitrogen gas and a pre-set current in order to remove foreign matter existing on the circuit board.

The predetermined amount may be set as a calibration data value previously stored to correspond with the pre-set current.

The first process may further include: performing a failure diagnosis for the antenna based on an electromagnetic strength received after a battery is inserted into the battery accommodation member and then completing the failure diagnosis.

The antenna diagnosis method may further include: performing learning for a communication distance based on the received electromagnetic field strength when the antenna is normal as a result of the failure diagnosis for the antenna, and then storing a learning value in the communication component as calibration data for the communication distance.

The antenna diagnosis method may further include: performing learning for the communication distance based on the electromagnetic field strength received when the antenna is normal as the result of the failure diagnosis; counting the number of times of performing the learning for the communication distance; calculating an average value for learning values obtained through the learning for the communication distance when the number of times of performing the learning reaches the predetermined number of times; and setting the average value as a calibration data value and storing the calibration data value in the communication component of the circuit board.

The first process may further include: a circuit board diagnosis process of performing a diagnosis on a plurality of components for communication with the vehicle after the plurality of components are embedded through a soldering process.

The circuit board diagnosis method may include: a diagnosis and inspection step of comparing a measured value for each of a resistance value, a voltage value, and a current value for each of the embedded components and a pre-set specific value, and determining that each of the components is normally embedded when it is determined that the measured value and the specific value coincide with each other as a result of the comparison; and a function inspection step of comparing a received value and a pre-set value in terms of electromagnetic field strength for each of the embedded communication components, and determining that the communication component normally operates when it is determined that the received value and the pre-set value coincide with each other as a result of the comparison.

Each of the communication components may be one of the antenna coil and the antenna pattern which are configured to receive electromagnetic field strengths provided in the X, Y and Z axes for communication with the vehicle.

The circuit board diagnosis process may include: storing the pre-set specific values as calibration data values when it is determined that the communication components embedded in the circuit board are normal after performing the diagnosis and inspection step and the function inspection step for the embedded components and communication components.

The circuit board diagnosis process may further include: indexing a normal code at a predetermined position on the circuit board after the calibration data is stored.

The third process further may include: removing an organic material by activating an interface on a surface of the molding dies using nitrogen, argon, or hydrogen gas before the molding dies are installed on the inserting blocks and the circuit board.

The third process further may include: installing a predetermined number of injector pins configured to remove the inserting blocks from the molding dies at predetermined positions on the top and bottom surfaces of the inserting blocks, respectively; and installing a predetermined number of injector pins configured to remove the inserting blocks from the molding dies at predetermined positions on the bottom surface of the circuit board.

The third process further may include: installing a predetermined number of support pins configured to support the circuit board at predetermined positions on the top surface of the circuit board after the molding dies are installed.

The third process may further include: installing a positioning pin configured to indicate a installed position of circuit board on each circuit board.

The fourth process may include: maintaining the inside of the cavity in a vacuum state; and filling a thermosetting resin in the inside of the cavity through a plunger by performing a high pressure and high temperature press process.

In the fourth process, a transfer molding process may be performed using the thermosetting resin so as to form the resin case.

The fourth step may further include: performing plasma cleaning to remove foreign matter before the inside of the cavity is maintained in the vacuum state and the resin is filled in the inside of the cavity.

The thermosetting resin may contain an epoxy-based resin and a wax component.

The fourth process may further include: a noise removing process of removing a noise component generated on a surface of the primarily cured resin case before proceeding to the fifth process.

The noise removing process may include: a positive noise removing step of removing noise which is a resin component existing on the surface of the primarily cured resin case and protruding to the outside; and a negative noise removing step of removing noise produced since the resin component is not filled on the surface of the primarily cured resin case.

The positive noise may include at least one of flash which is the resin component protruding to the outside of the resin case and burr of a positive component which is the resin component protruding to the outside of the primarily cured resin case.

The positive noise removing step may be provided to sense a shape of the positive noise using a sensor and then remove the flash or the positive type burr based on a rotation force of a motor which is set based on the shape of the positive noise.

The shape of the positive noise may be provided as a noise size including the protruding thickness and size of the positive noise The rotation force of the motor may be set based on a proportional relation equation predetermined with respect to the size of the positive noise, and is set as a calibration data value for the rotation force of the motor in relation to the size of the positive noise.

The negative noise may be one of burr of the negative component introduced into the inside of the primarily resin case and a dent which is not filled with the resin of the primarily cured resin case.

The negative noise removing step may be provided to sense a shape of the negative noise and then perform a sealing treatment based on an amount of resin which is set based on the shape of the negative noise so as to remove the burr of the negative component or the dent.

The amount of resin may be obtained through a proportional relation equation predetermined based on the shape of the negative noise, and the amount of resin in relation to the shape of the negative noise is set as a calibration data value.

The noise removing step may further include: determining whether the card type wireless transceiver is defective based on the sealed state after removing the negative noise.

The fifth process may include: removing the inserting blocks by thermal contraction by developing a difference between a temperature of the inserting blocks and a temperature of the resin case; and completely curing the resin case by maintaining the resin case under a pre-set high temperature for a predetermined length of time.

In the complete curing of the resin case, the resin case may be fixed through a pushing jig after the inserting blocks are removed from the resin case, the resin case fixed to the pushing jig is charged into an oven, then, a predetermined amount of nitrogen gas is introduced into the oven, and then, the resin case is secondarily cured under a pre-set temperature for a predetermined length of time.

In the fifth process, secondary curing may be performed after the resin case is fixed to a fixing member installed within the oven in a state where the inserting blocks are removed from the molding dies, and oxygen existing within the oven is removed fixing member installed within the oven.

The fifth process may include: a first step of fixing the resin case to the fixing member within the oven in the state where the inserting blocks are removed from the molding dies; a second step of introducing a predetermined amount of nitrogen at a predetermined pressure through an inlet provided at a predetermined position of the oven so as to discharge the oxygen existing within the oven through an outlet; a third step of measuring an amount of the oxygen within the oven using a signal supplied from an oxygen sensor installed at a predetermined position within the oven; and a fourth step of comparing the measured amount of oxygen with a pre-set determination reference value and performing the secondary curing when the amount of oxygen does not exceed the determination reference value.

The determination reference value may be set to be 1000 ppm or less.

In the fourth step, the resin case may be cured under a high temperature of 175° C. or more for four hours.

The fifth process may include: removing inserting blocks from the resin case by thermal contraction by developing a difference between a difference of the inserting blocks and a temperature of the resin case; pushing the resin case molded in the fourth process so as to reduce a gap between the resin case molded in the fourth process and the circuit board using a pushing member; fixing the resin case through the pushing jig; and curing the resin case fixed to the pushing jig by charging the resin case into the oven, then introducing a predetermined amount of nitrogen gas into the oven, and then curing the resin case for the predetermined length of time.

The pushing of the resin case may be provided to fix the resin case molded in the fourth process to a predetermined position of a base member, transfer a force generated due to a pushing operation of a pushing operation member of a manufacturer to a pushing plate, and transfer a force applied downward from the pushing plate to predetermined position on the resin case having the circuit board installed therein.

The fifth process may further include: a resin case cleaning process of removing a noise component of the resin existing on the outside of the completely cured resin case.

The resin case cleaning process may include: a resin removing step of primarily removing the resin of the positive component remaining on a connector and a connector plate which is exposed to the outside of the resin case by injecting carbon dioxide at a pre-set high pressure; and a noise removing step of secondarily removing the noise of the positive component remaining on the outside of the resin case.

The resin removing step may be proved to remove inject the high-pressure carbon dioxide gas at a pre-set high pressure (50 bar) to remove the resin from the connector and the connector plate, and to remove the component removed from the resin from the connector and the connector plate from the resin case using a vacuum suction device.

The noise removing step may be provided to remove the positive noise component by grinding the positive noise component based on the rotation force of the motor which is pre-set based on the shape of the positive noise after sensing the shape of the positive noise using the sensor.

The fifth process may further include: a spot removing process of removing spot-shaped noise inserted between resin portions of the cured resin case by scanning predetermined amount of laser.

The spot removing process may be provided to scan the predetermined amount of laser to the surface of the cured resin case.

The spot removing process may be provided to scan the predetermined amount of laser which is set to correspond to a size of the spot to the surface of the cured resin case.

The fifth process may further include: a noise removing process of removing a noise component produced on the surface of the resin case cured in the fifth process.

The noise removing process may include: forming burr which is noise of a positive component by performing an additional sealing treatment on burr which is noise of negative component formed on the surface of the cured resin case, using the resin; and grinding the noise of the positive component with a pre-set rotation force of the motor to remove the noise of the positive component.

The method may further include: an end of line (EOL) diagnosis process of performing a final diagnosis on the wireless transceiver at the end of line.

The EOL diagnosis process may include: comparing the electromagnetic field strength for the communication distance which is received by the pushing operation of the button and the electromagnetic field strength previously stored as the calibration data value; and determining the card type wireless transceiver as a normal one and shipped when it is determined that the compared electromagnetic field strengths coincide with each other as a result of comparison so as to ship the card type wireless transceiver.

In the EOL diagnosis process, when the electromagnetic field strengths do not coincide with each other as the result of comparison in step, the card type wireless transceiver may be determined as a defective one and discarded.

The method may further include: forming a diagnosis point by coating solder cream on a surface of the circuit board which is opposite to the surface of the circuit board where the components are mounted in the first process, and then, solidifying the solder cream under a high temperature.

The method may further include: e) expositing to the outside of the resin case configured to encapsulate the circuit board so as to diagnosis a defect for the components mounted in the circuit board; and f) diagnosing the defect for the components mounted on the circuit board using a diagnosis equipment.

Step e) is provided to perform one of a horizontally grinding process and a melting process of the resin case in which the solder is attached.

The method may further include: fixing logo and decoration sheets using double-sided tape after performing the fifth process.

Advantageous Effect

As described above, in a wireless transceiver manufacturing process according to the present disclosure and a method of manufacturing the same, both of the top and bottom sides of a circuit hoard, on which components are mounted, are encapsulated using a resin material in a state where the circuit board floats in a cavity. A pin configured to support the circuit board is installed and a decoration flat member is fixed to the surface of the circuit board opposite to the side where the pin is installed using double-sided tape. As a result, it is possible to prevent the resin case from being warped by heat generated from the circuit board. In addition, it is possible to omit an existing post-processing process for preventing the damage to the circuit board which may be caused when one side of the circuit board is entirely exposed to the outside. Thus, steps of the manufacturing process and the manufacturing costs can be reduced.

BRIEF DESCRIPTION OF THE DRAWINGS

Although following drawings attached to the present disclosure illustrate a preferred embodiment of the present disclosure to help understanding of the technical spirit of the present disclosure along with the detailed description of the present disclosure as described below, the present disclosure should not be interpreted to be limited to elements depicted in the drawings.

DETAILED DESCRIPTION OF THE EXEMPLARY EMBODIMENTS

Figure 1:
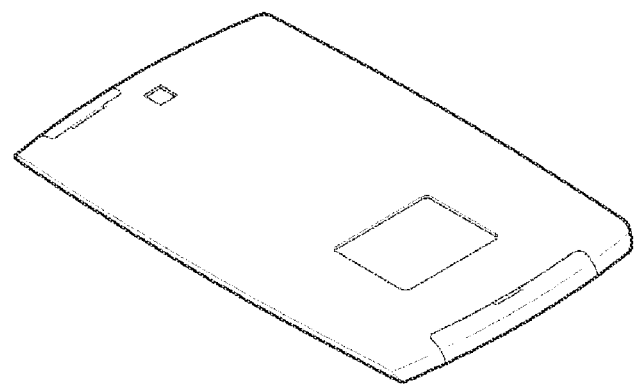
FIG. 1 is a view illustrating a card type wireless transceiver for a vehicle according to an exemplary embodiment of the present disclosure.

In order to sufficiently understand the present disclosure, aspects of the embodiment of the present disclosure and merits of operation of the present disclosure, accompanying drawings showing the preferred embodiment of the present disclosure and contents described in the drawings must be referred to.

In order to sufficiently understand the present disclosure, aspects of the embodiment of the present disclosure and merits of operation of the present disclosure, accompanying drawings showing the preferred embodiment of the present disclosure and contents described in the drawings must be referred to. Further, the same elements as those of the prior art are indicated by the same reference numerals and the same names.

Figure 2:
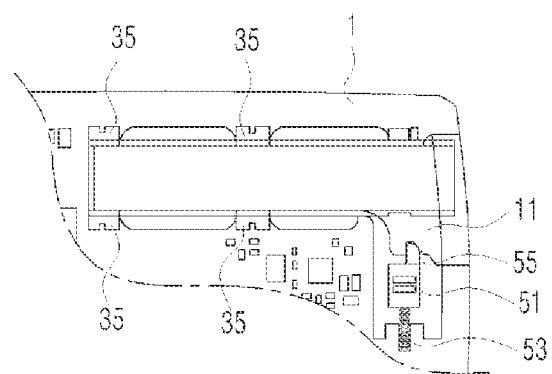
FIG. 2 is a partial cut-away view illustrating a configuration of an emergency key accommodation device according to an exemplary embodiment of the present disclosure.
Figure 3:
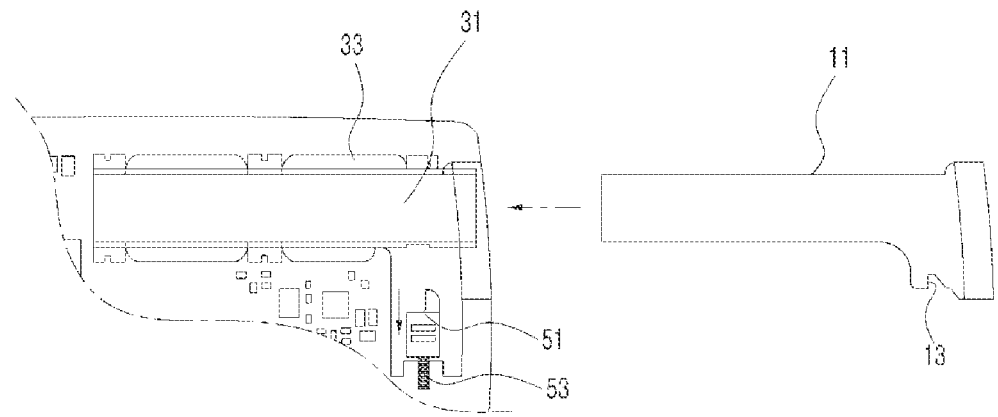
FIG. 3 is a partial cut-away view illustrating the emergency key accommodation device illustrated in FIG. 2.
Figure 4:
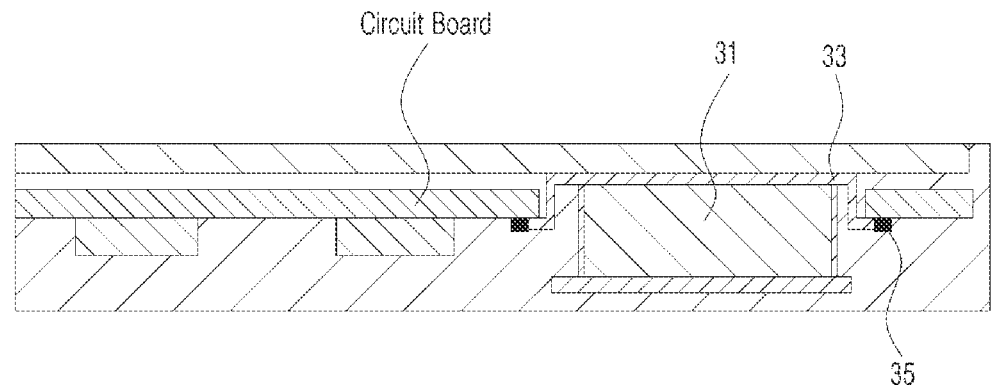
FIG. 4 is a cross-sectional view illustrating a configuration of an emergency key accommodation member of the emergency key accommodation device illustrated in FIG. 2.
Figure 5:
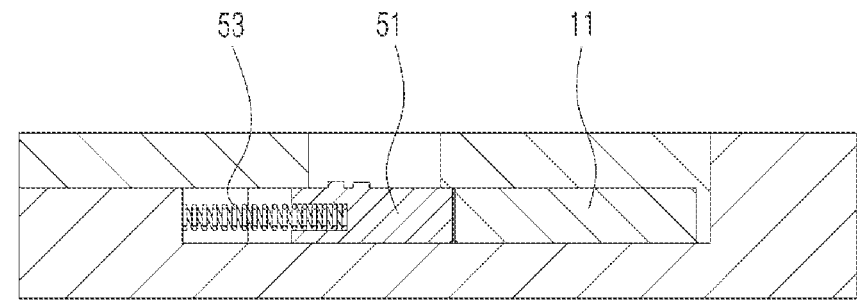
FIG. 5 is a cross-sectional view illustrating a configuration of a switching member of the emergency key accommodation device illustrated in FIG. 2.

FIG. 1 is a view illustrating a configuration of a card type wireless transceiver according to an exemplary embodiment of the present disclosure, FIG. 2 is a cut-away view illustrating a state where an emergency key is accommodated in an emergency key accommodation device of FIG. 1, FIG. 3 is a cut-away view illustrating a state where an emergency key is released from the emergency key accommodation device of FIG. 1, FIG. 4 is a partial cross-sectional view illustrating a configuration of an emergency key accommodation member of the emergency key accommodation device illustrated in FIG. 1, and FIG. 5 is a cross-sectional view illustrating a configuration of a switching member of the emergency key accommodation device.

An emergency key accommodation device according to an exemplary embodiment of the present disclosure will be described with reference to FIGS. 1 to 5. As illustrated in the figures, the emergency key accommodation device according to the exemplary embodiment of the present disclosure is applied to a card-shaped wireless transceiver configured to control driving of electric components of a vehicle based on an authentication result after executing authentication through short-distance communication with the vehicle.

The emergency key accommodation device according to the exemplary embodiment of the present disclosure includes an emergency key 11, an emergency key accommodation member 30 housed within a body of a card type wireless transceiver to accommodate the emergency key 11, and a switching member 50 installed on one side of the body to prevent, removal of the emergency key 11 accommodated in the emergency key accommodation member.

Here, the emergency key 11 and the emergency key accommodation member 30 are provided in a " ㄱ " shape.

Here, the emergency key accommodation member 30 includes: an emergency key accommodation slot 31 provided in the body 1 so that the emergency key 11 is inserted into the emergency key accommodation slot 31; and a reinforcement unit 33 configured to fix the emergency key 11 to the top, bottom, left and right walls of the body 1.

The reinforcement unit 33 may be formed of a rigid stainless steel so as to protect the body from damage which may be caused due to frequent removal and insertion operations of the emergency key 11. Of course, it may be apparent to a person ordinarily skilled in the art that the reinforcement unit may be made of any other material that has rigidity corresponding to that of the stainless steel.

The reinforcement unit 33 of the emergency key accommodation member 30 is fixedly installed on the one side of a circuit board which is fixedly installed inside the body 1 of the card type wireless transceiver, through a soldering process.

In addition, the switching member 50 is installed on one side of the emergency key accommodation member 30 of the body 1 and provided to prevent the insertion or removal of the emergency key 11 in relation to the inside of the emergency key accommodation member 30 according to the user's leftward or rightward moving manipulation state.

The switching member 50 includes: a switch 51 configured to allow the user to select the removal or insertion of the emergency key in relation to the inside of the emergency key accommodation member through the user's leftward or rightward manipulation; an elastic unit 53 that is installed on one side of the switch 51 to generate or restore elastic force depending on the leftward or rightward manipulation of the switch 51; and a latching step 55 provided on the other side of the switch 51 so as to allow the emergency key 11 to be accommodated in the reinforce unit. 33 when the emergency key 11 is moved toward and accommodated in the emergency key accommodation member 30 by the elastic force of the elastic unit 53.

Meanwhile, the emergency key 11 includes a latching recess 13 which is provided on a position corresponding to the latching step 55 and is fixedly latched to the latching step 55 of the switching member 50 so as to maintain the accommodated state of the emergency key 11.

With this configuration, when a driver inserts the emergency key 11 into the emergency key accommodation slot 31 in the emergency key accommodation member 30, the elastic unit 53 is elastically compressed, and when the latching step 55 is moved in a direction which is the same as the switch manipulation direction, the elastic force restored in the elastic unit 53 is exerted to cause latching recess 13 of the emergency key 11 to be latched to the latching step 55. Accordingly, the emergency key 11 is held in the state accommodated in the emergency key accommodation slot 31 in the emergency key accommodation member 30.

Meanwhile, when the driver moves the switch 51 leftward so as to remove the emergency key 11 from the emergency key accommodation member 30, the elastic unit 53 is elastically compressed so as to allow the latching step 55 to be moved in the direction which is the same as the switch manipulation direction and the latching step of the emergency key 11 engaged with the latching step 55 is disengaged from the latching step 55. Then, the emergency key 11 may protrude to the outside.

Accordingly, the emergency key 11 may be released from the key accommodation slot 31 in the emergency key accommodation member 30.

According to an exemplary embodiment of the present disclosure, the emergency key accommodation device is provided with the rigid emergency key accommodation member so as to protect the body from damage which may be caused due to frequent removal and insertion of an emergency key. The emergency key accommodation member is fixedly installed on a circuit board through a soldering process. The body is provided with a switching member that prevents the insertion and removal of the emergency key depending on the leftward or rightward movement operation of a switch. Accordingly, the emergency key accommodation device may accommodate the emergency key even if the emergency key has a size corresponding to a size of a credit card (about 83 mm×53 mm) and a thickness which is limited to be equal to or less than 3.4 mm (preferably about 2 mm). As a result, the emergency key accommodation device is easy to carry, and the thin body may be protected from the risk of damage which may be caused due to frequent insertion and removal of the emergency key. In addition, the insertion and removal of the emergency key may be facilitated, the loss of the emergency key may be prevented, and the manufacturing process of the emergency key accommodation member may be facilitated to reduce the manufacturing costs for the overall device. Furthermore, when dust enters into a circuit portion within the body during the insertion and removal of the emergency key, it is possible to prevent the dust from being transferred to the circuit of the circuit board. Since a handle portion of the emergency key may be formed in a shape which gives a sense of integration with the body of the wireless transceiver, the beautiful appearance may be maintained.

Figure 6:
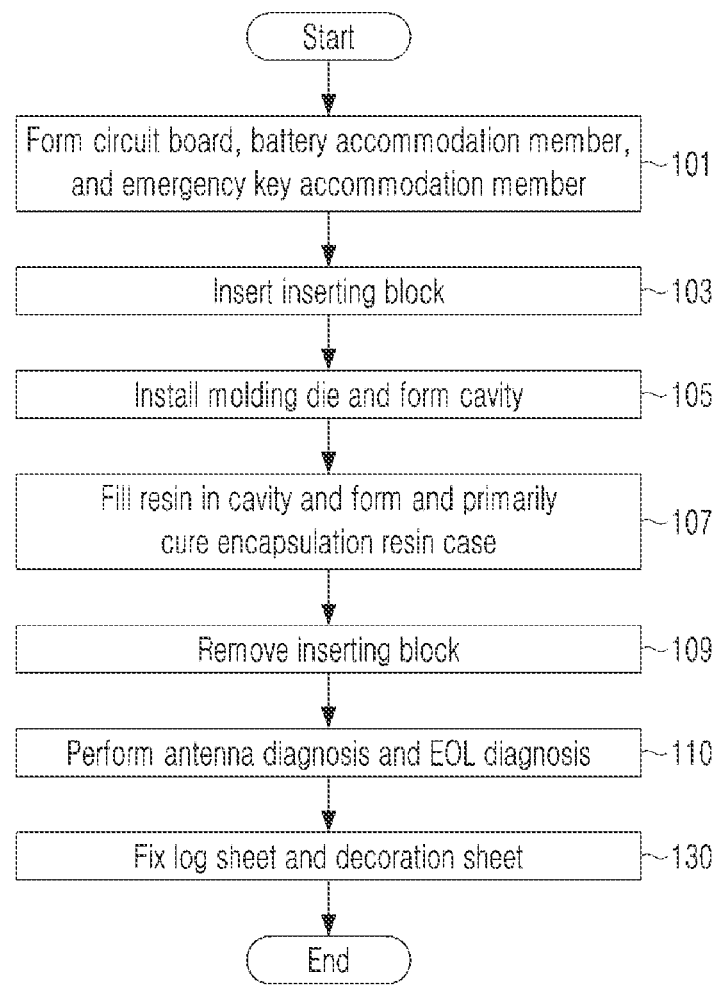
FIG. 6 is a flowchart, illustrating a process of manufacturing the vehicle wireless transceiver illustrated in FIG. 1.
Figure 7:
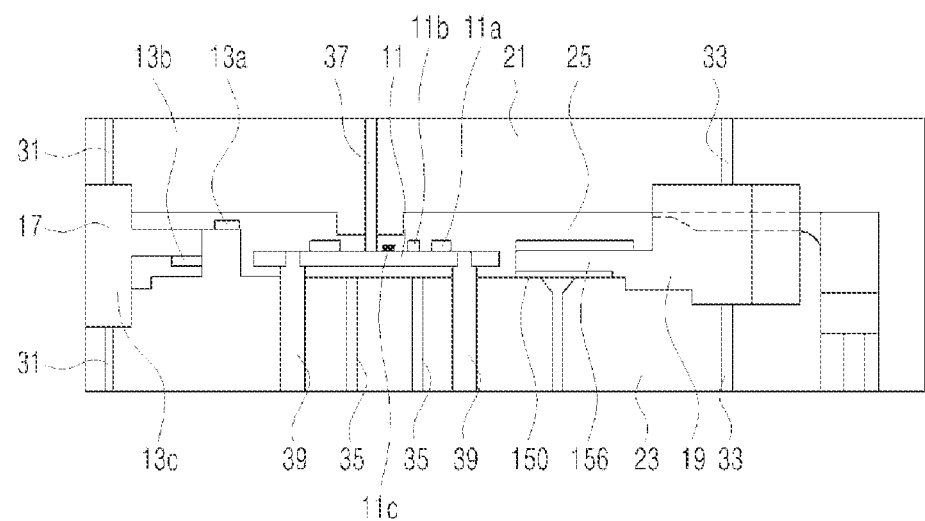
FIG. 7 is a cross-sectional view of a vehicle wireless transceiver manufactured according to the vehicle wireless transceiver manufacturing process illustrated in FIG. 6.
Figure 8:
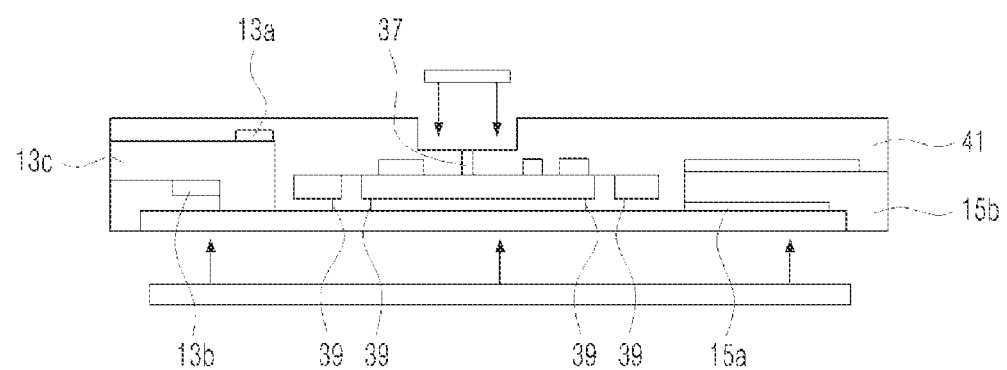
FIG. 8 is a view illustrating a configuration of the vehicle wireless transceiver after the manufacturing process of the vehicle wireless transceiver illustrated in FIG. 1.

FIG. 6 is a flowchart illustrating a manufacturing process of the vehicle wireless transceiver illustrated in FIG. 1, FIG. 7 is a cross-sectional view illustrating a vehicle wireless transceiver which is manufactured according to the vehicle wireless transceiver manufacturing process illustrated in FIG. 6, and FIG. 8 is a view illustrating a configuration of the vehicle wireless transceiver after the vehicle wireless transceiver manufacturing process illustrated in FIG. 6. Hereinafter, a vehicle wireless transceiver manufacturing process according to another exemplary embodiment of the present disclosure will be described in detail with reference to the figures.

First, in first step 101, a circuit board 11 in which components are embedded, a battery accommodation member mounted on one side of the circuit board 11 and including battery terminals 13a and 13b connected to the circuit board 11, a reinforcement unit 15a mounted on the other side of the circuit board 11 and connected with the circuit board 11 through a soldering process, and an emergency key accommodation member having an emergency key that accommodates the accommodation slot 15b are formed.

Figure 9:
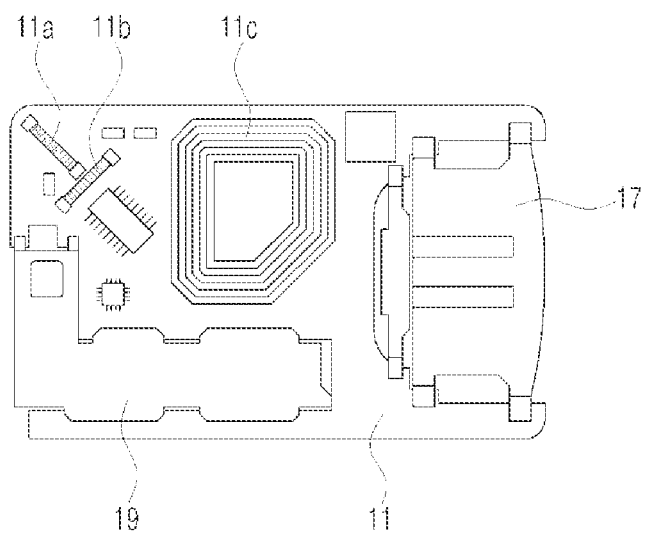
FIG. 9 is a cross-sectional view illustrating the circuit board illustrated in FIG. 6.

Here, as illustrated in FIG. 9, examples of the communication-related components embedded in the circuit board 11 include: antenna coil units 11a and 11b, each of which includes a bobbin and a coil wound around the bobbin and performs data communication with a vehicle in direction of an X or Y axis; and an antenna pattern portion 11c which is formed by etching a metallic copper foil layer of the circuit board 11 in a pre-set pattern and performs data transmission/reception with the vehicle.

Figure 10:
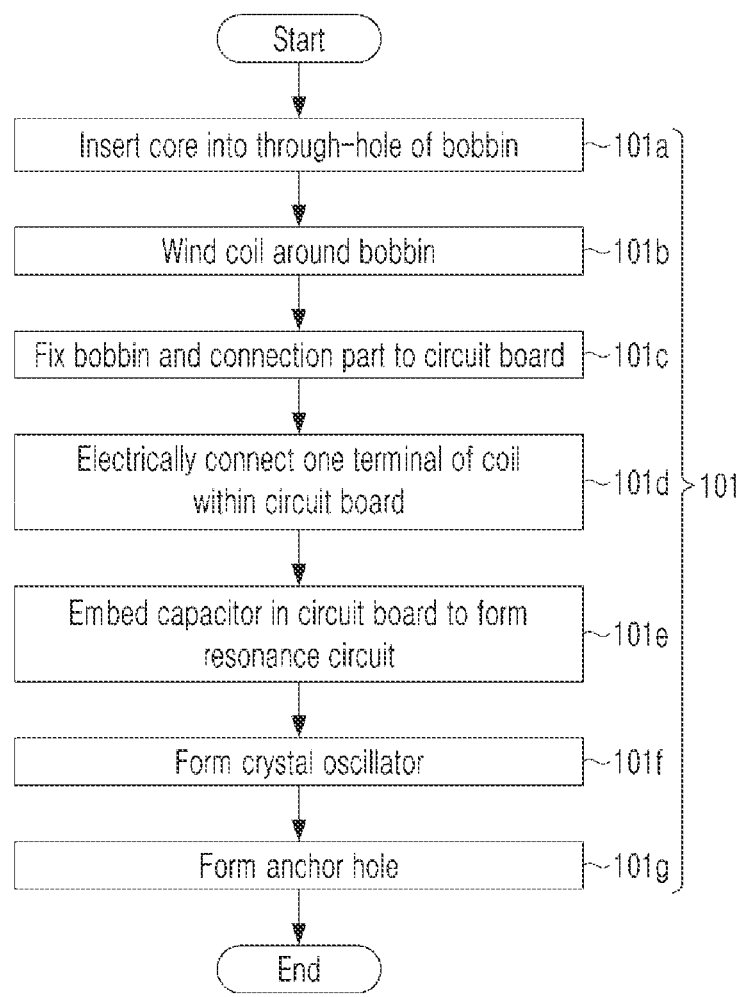
FIG. 10 is a flowchart illustrating a manufacturing process of an antenna coil unit of the circuit board illustrated in FIG. 9.

FIG. 10 is a flowchart illustrating a manufacturing process of the antenna coil units 11a and 11b. The manufacturing process of the antenna coil units 11a and 11b will be described with reference to FIG. 10. First, a core 11 formed of a rod-shaped magnetic material is inserted into a through-hole and a coil having a diameter which is equal to or smaller than a predetermined value is wound around a bobbin having the through-hole into which the core 11 (steps 101a and 101b), a connection portion 31 extending from the bobbin along the longitudinal direction of the coil and fixed to the bobbin and one side of the bobbin are fixedly installed at a predetermined position on the circuit board 11, and then one side of the coil is electrically connected to the circuit board through the connection portion (steps 101c and 101d).

Then, a capacitor is embedded in the circuit board 11 at a predetermined position and electrically connected with one terminal of the coil so as to form a resonance circuit (step 101e).

In addition, the antenna coil units 11a and 11b form a ceramic type crystal oscillator which generates clocks of predetermined frequency (step 101f).

Here, the antenna coil units 11a and 11b are provided to execute data communication with the vehicle in the directions of X and Y axes. Each of the antenna coil units 11a and 11b is formed by winding a coil around a bobbin and the antenna coil units 11a and 11b are installed on the circuit board 11 to be orthogonal to each other in the directions of X and Y axes.

Here, the antenna coil units 11a and 11b are provided in such a manner that the input and output ends of the coils are connected to a corresponding pin of a Micro Control Unit (MCU) and power is input to another corresponding pin of the MCU.

In addition, the antenna pattern portion 11c is provided to execute data communication with the vehicle in the direction of Z-axis which is orthogonal to the X axis and Y axis of the antenna coil units 11a and 11b. The antenna pattern portion 11c is formed by coating an adhesive on a flexible film, then performing heat treatment and exposure treatment on a metallic copper foil layer on the circuit board 11 on which the metallic copper foil is welded to be stacked, and then performing etching treatment on the metallic copper along a predetermined pattern.

Meanwhile, the circuit board improves mold-fluidity on the wide top and bottom surfaces of the card type vehicle wireless transceiver through anchor holes 11d to prevent non-molding such as occurrence of voids. The anchor holes 11d are formed in a predetermined area of the circuit where components 11 such as the antenna coils 11a and 11b are not embedded in order to basically prevent the flexural phenomenon of the body and peeling phenomenon which are generated when epoxy resin is separated from the circuit board (step 101g).

Figure 11:
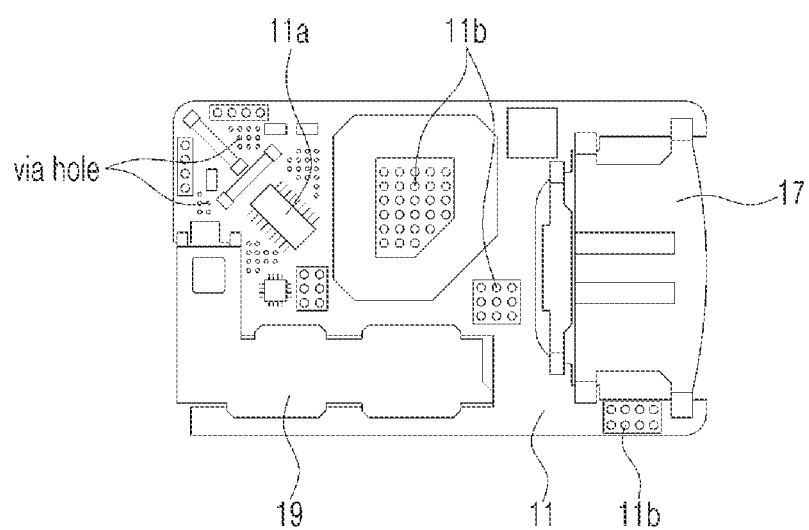
FIG. 11 is a view illustrating a state where an anchor hole is formed in the circuit board illustrated in FIG. 9.

At this time, the circuit board 11 is formed with the anchor holes 11d as illustrated in FIG. 11.

Meanwhile, after the components that perform communication with the vehicle are embedded through the soldering process in first step 101, a circuit board cleaning process is performed so as to remove unnecessary solder from the circuit board.

Figure 12:
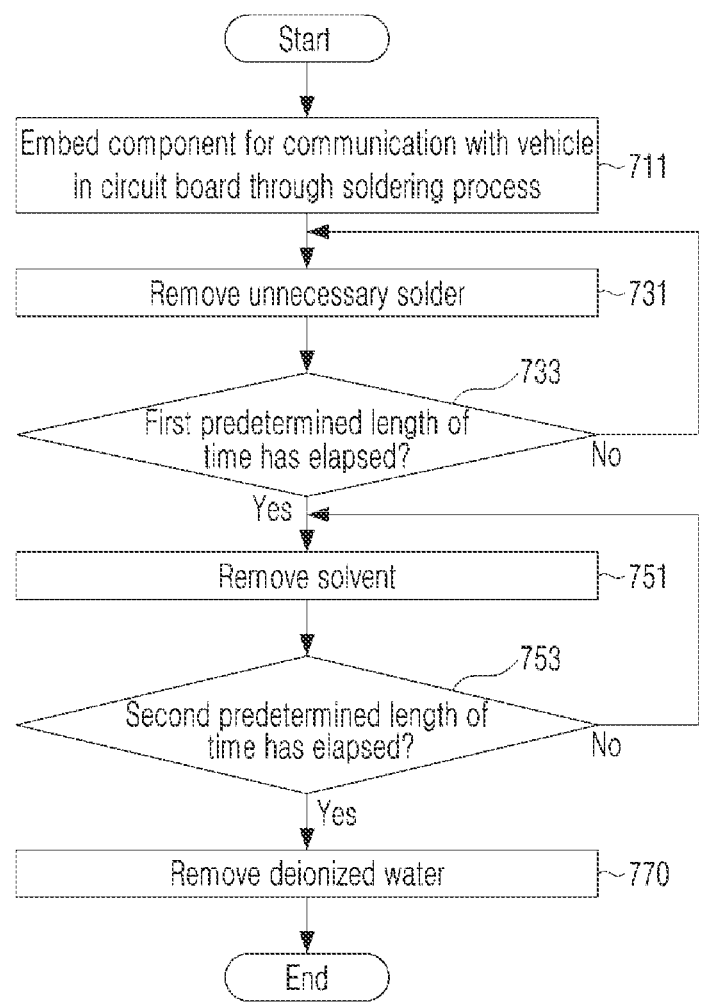
FIG. 12 is a view exemplifying a procedure of performing a circuit board cleaning process in a first process illustrated in FIG. 6.

That is, FIG. 12 is a view exemplifying a procedure of performing a circuit board cleaning process in first step illustrated in FIG. 6. Hereinafter, the circuit board cleaning process will be described with reference to FIG. 12.

First, as illustrated in FIG. 12, the circuit board cleaning process includes: a solder removing step 731 of removing unnecessary solder from the circuit board by inserting a plurality of circuit boards into recesses of a separate magazine and then immersing the magazine in solvent contained in a container for a first predetermined length of time; and a solvent removing step 751 of removing the solvent component by immersing the magazine in deionized water for a second predetermined length of time after the first predetermined length of time has elapsed.

In addition, plural circuit boards with communication components which are embedded therein in step 711 are inserted into one magazine illustrated in FIG. 4 and then, immersed in the solvent contained in the solvent, container for a first predetermined length of time (e.g. 30 minutes) in the solder removing step 731.

Then, it is determined whether the first predetermined length of time has elapsed for the solder removing step (step 733). When it is determined that the first predetermined length of time has elapsed, the process proceeds to the solvent removing step 751.

In the solvent removing step, the magazine is immersed in the deionized water in the deionized water container so as to remove the solvent component (step 751).

In addition, it is determined whether the second predetermined length of time has elapsed for the solvent removing step (step 753), and when it is determined that the second predetermined length of time has elapsed, the process proceeds to a deionized water removing step (step 770).

In the deionized water removing step, each of the plural circuit boards is removed from the magazine, then charged into an oven, and then heated at a high temperature (e.g., 150° C.) for a predetermined length of time (e.g., 30 minutes) to remove the deionized water.

That is, the first process 101 proceeds to the solder removing step after the communication components that execute data communication with the vehicle are embedded in the circuit board 11 (step 711).

That is, after the plural circuit boards are inserted into the magazine, the magazine is immersed in the solvent solution contained in the solvent container for the first predetermined length of time (30 minutes) (step 731). Then, after the first predetermined length of time has elapsed (step 733), the process proceeds to the solvent removing step (step 751).

After the magazine is immersed in the deionized water contained in the container for a second predetermined length of time in the solvent removing step (step 751), and when the second predetermined length of time elapses (step 753), the process proceeds to the deionized water removing step (step 770).

In the deionized water removing step, the circuit board. 11 is charged in the oven and heated at a high temperature (150° C.) for a third predetermined length of time (30 minutes) to remove the deionized water remaining on the circuit board 11.

Then, the battery accommodation member is provided such that, when a battery is accommodated in the battery accommodation recess 13c, a current flows between the battery terminals 13a and 13b and the flow of such a current is transferred to the circuit board 11.

In addition, the emergency key accommodation member illustrated in FIGS. 2 to 5 is provided such that the reinforcement unit 15a having the emergency key accommodation slot 15c is fixed to a predetermined position on the circuit board 11 through the soldering process.

Figure 13:
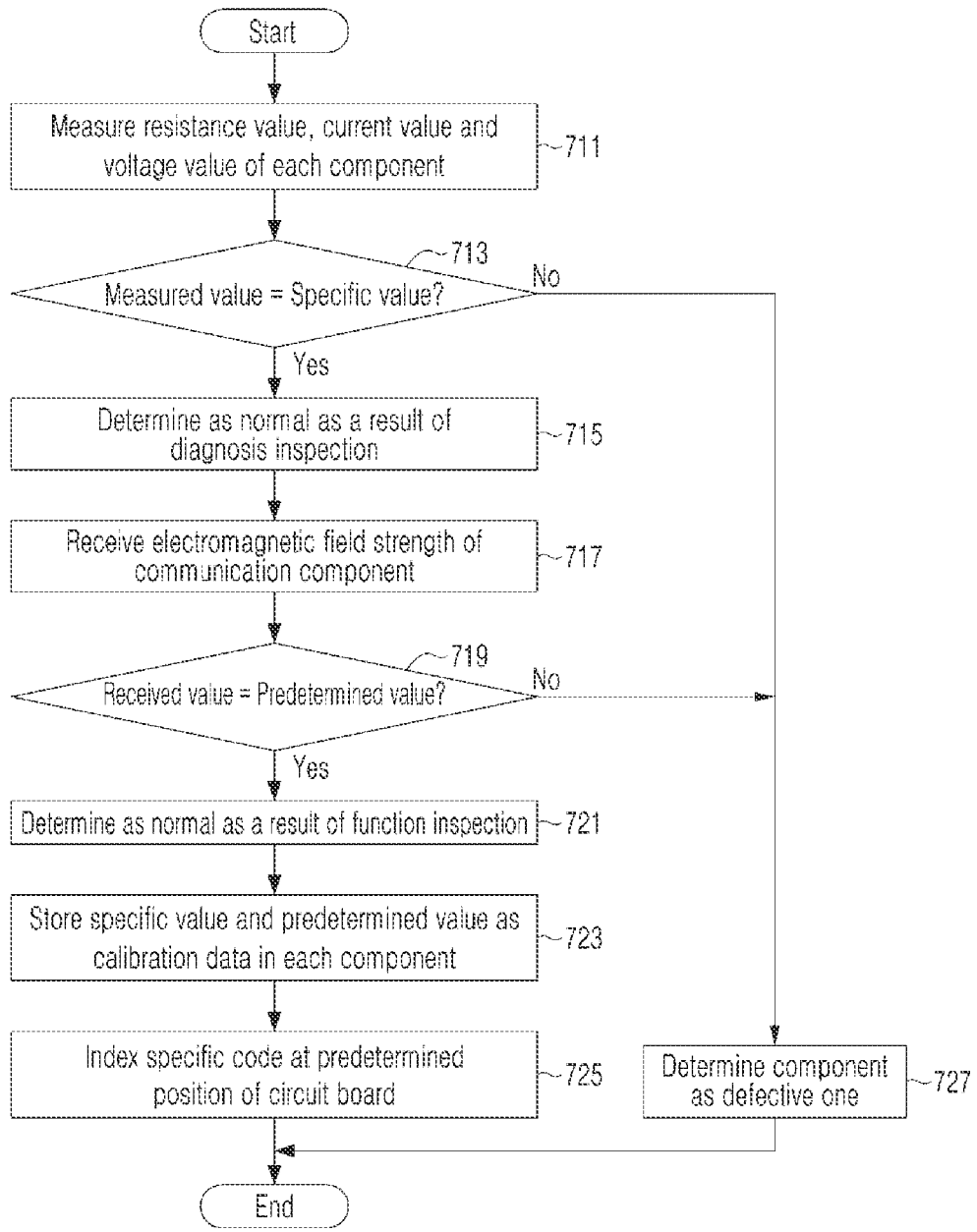
FIG. 13 is a flowchart illustrating a diagnosis and a function inspection procedure for components of the circuit board illustrated in FIG. 9.

Thereafter, diagnosis and function inspections are performed for the components for communication with the vehicle which are embedded in the first process 101 through the soldering process. FIG. 13 is a flowchart illustrating a diagnosis and function inspection process for the components of the circuit board illustrated in FIG. 9.

Here, the components for communication with a vehicle include various ordinary components and communication components. The ordinary components include a microcomputer that responds to a request signal transmitted from a vehicle, a clock generator that drives the microcomputer, a resistor, and a capacitor, and the communication components include antenna coils that perform transmission/reception for a request signal supplied from the vehicle in the X, Y and Z directions and a response signal for the request signal from the microcomputer.

Since the configurations of the components for communication with the vehicle are well-known in the related art, detailed descriptions thereof will be omitted.

As illustrated in FIG. 13, in step 811, the resistance value, current value, and voltage value of each component are measured and compared with pre-set specific values (step 813).

When the values measured in step 813 coincide with the specific values, the corresponding component is determined as a normal one in step 815. In step 815, a diagnosis inspection is performed so as to determine whether a component is normally embedded.

Upon being determined as a normal one in step 815, a communication component (antenna coil) receives an electromagnetic field intensity for a predetermined communication distance in step 817, and the value of the received electromagnetic field intensity is compared with a pre-set value (step 819).

In addition, when the received value and the pre-set value coincide with each other in step 819, the communication component is determined as a normal one in step 821. In step 821, a function inspection is performed so as to determine whether a communication component operates normally.

When components are determined as normal ones in the function inspection in step 821, the specific values and measured values are respectively stored in the components as calibration data values in step 823.

Then, in step 825, a specific circuit board cord is indexed at a predetermined position on the circuit board 11 and then, a second process 103 is carried out.

That is, the resistance values, current values, and voltage values for respective components measured in step 811 and pre-set specific values are compared with each other (step 813).

When it is determined that the measured values and the specific values coincide with each other in step 813, the components, for which the measured values and the specific values coincide with each other, are determined as normal ones in the diagnosis inspection in step 815 which determines whether or not a component is normally embedded in the circuit board.

When a communication component (antenna coil) is determined as a normal one in the diagnosis inspection, a function inspection is performed for the communication component (antenna coil).

That is, the electromagnetic intensity of an RF signal supplied from the vehicle and received by each of the communication components is measured in step 817, and then the measured values and the pre-set values are compared with each other in step 819.

When the measured value and the preset value coincide with each other for a communication component in step 819, the communication component is determined as a normal one in the function inspection performed in step 821 so as to determine whether a communication operates normally.

Then, in step 823, the specific values for respective components are stored in the components as calibration data values. Then, the specific code is indexed at a predetermined position of the circuit board 11 in step 825. And then, the second process 103 is carried out.

After the circuit board 11, the battery accommodation member, and the emergency key accommodation member are formed through the first process 101, the second process 103 is carried out. In the second process 103, inserting blocks 17 and 19 are inserted into the battery accommodation recesses 13c and 15b, respectively.

After the inserting blocks 17 and 19 are inserted in the second process 103, a circuit board cleaning process is performed so as to remove unnecessary solder from the circuit board.

Figure 14:
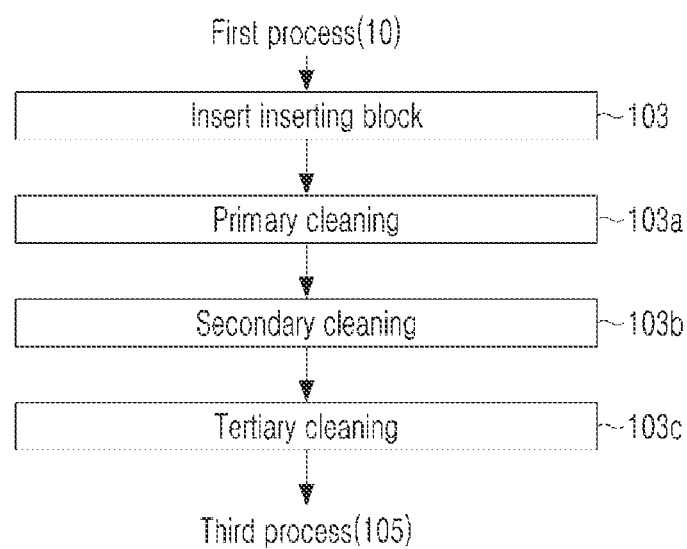
FIG. 14 is a view exemplifying a procedure of performing the circuit board cleaning procedure in the second process illustrated in FIG. 6.

FIG. 14 is a view exemplifying a circuit board cleaning process performed in the second process. Hereinafter, the circuit board cleaning process will be described with reference to FIG. 14.

First, after the inserting blocks are inserted, the circuit board cleaning process is performed so as to clean the surfaces of the circuit board 11. The circuit board cleaning process includes a primary cleaning step (step 103a) in which a plasma process is performed based on a predetermined amount (30 SCCM) of hydrogen and a pre-set current (60 A) to cause a chemical reaction between the hydrogen and organic material so as to remove the organic material from the surfaces of the components of the circuit board.

In addition, the circuit board cleaning process includes: a second processing step (step 103b) which is performed on the circuit board 11, in which a plasma process is performed based on a predetermined amount (20 SCCM) of argon and a pre-set current in order to improve adhesion between the circuit board 11 and the resin; and a tertiary cleaning step (step 103c) in which a plasma process is performed based on a predetermined amount of nitrogen gas and a pre-set current (190 A) so as to remove foreign matter existing on the circuit board 11.

That is, the predetermined amount of each of hydrogen, argon and nitrogen gas may be preferably set as calibration data value previously stored to correspond to the pre-set current for each of the hydrogen, argon, and nitrogen gases.

Here, the predetermined amount of the hydrogen, argon, and nitrogen gas corresponding to the pre-set currents have been obtained through plural tests for the pre-set currents and are pre-set as lookup table values so as to basically prevent erosion of the components of the circuit board of the vehicle wireless transceiver.

Through the primary cleaning step (step 103a) in the cleaning process for cleaning the components within the circuit board 11, the plasma process based on the predetermined amount (30 SCCM) of hydrogen and a pre-set current (30 SCCM) to cause a chemical reaction with organic material so that the organic material is removed from the surfaces of the components of the circuit board.

Thereafter, through the secondary cleaning step (103b), the plasma process is performed based on the predetermined amount (20 SCCM) of argon and the pre-set current (60 A) so as to improve adhesion between the circuit board 11 and the resin and then, the tertiary cleaning process 103c is carried out. In the primary cleaning step and the secondary cleaning step, the chemical reactions as illustrated in FIGS. 15a and 15b occur on the circuit board.

Figure 15:
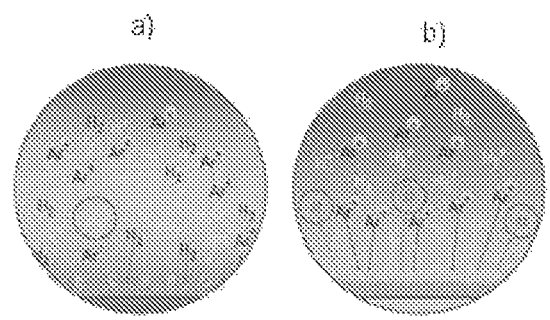
FIGS. 15a and 15b are views illustrating a chemical reaction generated by hydrogen at the time of primary cleaning of FIG. 14 and a chemical reaction generated by argon at the time of secondary cleaning.

FIGS. 15a and 15b are views illustrating a chemical reaction occurring due to hydrogen in the primary cleaning step and a chemical reaction occurring due to argon in the secondary cleaning step.

In the tertiary cleaning step (step 103c), the plasma process is performed based on the predetermined amount (30 SCCM) of nitrogen gas and the pre-set current (60 A) in order to remove the foreign matter existing on the circuit board 11.

Next, in the third process 105, previously patterned molding dies 21 and 23 are installed on the top and bottom sides of each of the accommodation member, the emergency key accommodation member, and the circuit board 11 so as to form cavities 25 (space layers) on the top and rear sides of the circuit board with the molding dies 21 and 23.

In addition, the third process 105 may further include a step of interface-activating the surfaces of the molding dies 21 and 23 using the nitrogen, argon, or hydrogen gas prior to installing the molding dies over the inserting blocks and the circuit board 11 so as to remove organic material.

In addition, in the third process 105, a pre-set number of injector pins 31 and 33 configured to remove the inserting blocks 17 and 19 from the molding dies 21 and 23 are installed at predetermined positions on the top and bottom surfaces of the inserting blocks 17 and 19.

Meanwhile, the third process 105 further including a step of installing a support pin 37 configure to support the circuit board 11 at a predetermined position on the top surface of the circuit board 11 after installing the molding dies 21 and 23, and positioning pins 39 configured to indicate installation positions of the circuit board 11 are installed on each circuit board.

After performing the third process 105, a fourth process 107 is carried out. In the fourth process 107, an epoxy-based resin is filled in the cavity 25 through a high-temperature and high-pressure press process so as to form a resin case 41 for encapsulating the left, right, top and bottom surfaces of the wireless transceiver.

That is, the fourth process 107 includes a step of maintaining the inside of the cavity in a vacuum state, and a step of filling a thermoset resin into the inside of the cavity through a plunger by performing the high-pressure and high-temperature press process.

Further, the fourth process 107 may mold the resin case by performing a transfer molding process using the thermoset resin. Since such a process is well-known in the related art, detailed descriptions thereof will be omitted.

Meanwhile, the fourth process 107 may further include a step of removing foreign matter by performing plasma cleaning prior to maintaining the inside of the cavity in the vacuum state and filling the resin in the inside of the cavity.

At this time, since a positive noise, which is formed as an unnecessary resin component protrudes to the outside of the resin case 41, and a negative noise, which is formed as the resin is not filled, are generated on the outer surface of the resin case 41, a noise removing process is performed to remove such noises.

Figure 16:
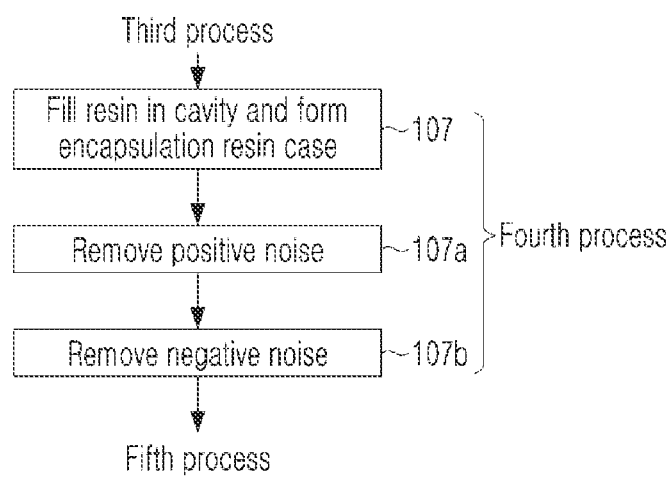
FIG. 16 is a flowchart illustrating a noise removing procedure of a resin case formed in the fourth process of FIG. 6.

FIG. 16 is a flowchart illustrating a noise removing process of a resin case formed in the fourth process of FIG. 6. The process of removing the noises generated on the resin case will be described in more detail with reference to FIG. 16.

Here, the noise removing process includes: a positive noise removing step 107a of removing a noise formed by the resin component existing on the surface of the primarily cured resin case and protruding outward (step 107a); and a negative noise removing step of removing a noise generated since the resin component is not filled in completely on the primarily cured resin case surface (step 107b).

Here, the positive noise is one of flash which is a resin component protruding outside the resin case and burr which is a resin component protruding outside the primarily cured resin case.

In the positive noise removing step (step 107a), the shape of the positive noise is sensed using a sensor, and then the flash or the positive burr is removed busing rotation force of a motor which is set based on the shape of the positive noise.

Here, the shape of the positive noise refers to a size of the positive noise including the protruding thickness and size of the positive noise. At this time, the rotation force of the motor is set based on a proportional relation equation previously defined in relation to the size of the positive noise, and is set as a calibration data value for the rotation force of the motor in relation to the size of the positive noise.

Meanwhile, the negative noise means one of burr of a negative component introduced into the primarily cured resin case and dent, which is not filled with the resin of the primarily cured resin case. At this time, in the negative noise removing step 107b, the shape of the negative noise is sensed using a sensor, and a sealing treatment is performed based on an amount of the resin which is set based on the shape of the negative noise to remove the burr of the negative component or the dent.

Here, although the size of noise of a spot shape is not described in detail, a series of processes that sense the size of noise introduced into the inside of the resin case is a technology well-known in the art, detailed descriptions thereof will be omitted.

In addition, the noise removing process may further include judging defectiveness for the card type wireless transceiver base on the sealing state after the sealing treatment is performed on the negative noise so as to remove the negative noise.

The amount of resin is calculated using a proportional relation equation defined based on the shape of the negative noise and the amount of resin in relation to the shape of the negative noise is set as a calibration data value.

That is, a noise removing process is performed in which an epoxy-based resin is filled in the cavity 25 through a high-temperature and high-pressure press process and then primarily cured to form a resin case 41 configured to encapsulate the left, right, top and bottom surfaces of the wireless transceiver, and then the noise produced on the surface of the resin case 41 is removed.

Here, in the noise removing process, through a positive noise removing step (step 107a) which removes the noise which is a resin component existing on the primarily cured resin case and protruding outward therefrom, the shape of the positive noise is sensed using a sensor and flash or burr of the positive noise component is removed by the rotation force of a motor which is set based on the shape of the positive noise.

In the subsequent noise removing process, the dent which exists on the primarily cured resin case and is not filled with the resin component and the burr of the negative component are removed through the negative noise removing step (step 107b).

That is, in the negative noise removing step (step 107b), the shape of the negative noise is sensed using a sensor, and a sealing treatment is performed based on the amount of resin set based on the shape of the negative noise to remove the burr of negative component or the dent.

In addition, in the noise removing process, defectiveness for the card type wireless transceiver may be judged based on the resin case which has been subjected to the sealing treatment so as to remove the negative noise.

In addition, after the noise removing process 108 is performed, a fifth process 109 is performed in which the inserting blocks 17 and 19 are removed from the molding dies 21 and 23 and then, the resin case 41, from which the inserting blocks 17 and 19 have been removed, is secondarily cured.

Figure 17:
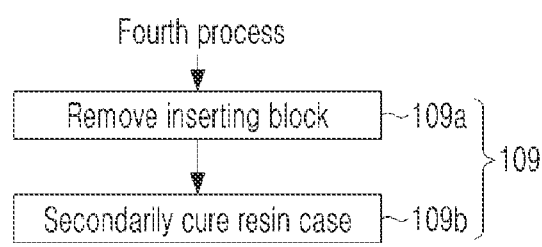
FIG. 17 is a view exemplifying an operation procedure of the fifth process of FIG. 6.

FIG. 17 is a view exemplifying an operation procedure of a fifth process in FIG. 6. Referring to FIG. 17, a process of secondarily curing the resin case after removing the inserting blocks will be described.

The fifth process 109 for secondarily curing the resin case includes: removing the inserting blocks 17 and 19 from the resin case 41 by thermal contraction by developing a difference between the temperature of the inserting blocks 17 and 19 and the temperature of the resin case 41 (step 109a); and secondarily curing the resin case 41 to be completely cured by maintaining the resin case 41 under a pre-set temperature for a predetermined length of time (step 109b).

Here, in the second curing step (step 109b), the resin case 41, from which the inserting blocks have been removed, is fixed using a pressing member so as to prevent the resin case 41 from being warped due to the high temperature during the secondary curing. In order to basically suppress metallic parts from being damaged, the resin case 41 fixed to the pressing member is charged into an oven and then a predetermined amount of nitrogen gas is introduced into the oven.

Then, the secondary curing is performed at a predetermined temperature for a predetermined length of time.

Here, preferably, the predetermined amount is 60 liters per minute and the predetermined temperature is 175° C. or higher. The predetermined length of time is set to be four hours or more. The predetermined amount, the predetermined temperature, and the predetermined length of time are values obtained as a result of performing tests a plurality of times so as to completely cure a resin case.

That is, through the inserting block removing step (step 109a), the inserting blocks 17 and 19 are removed from the resin case 41 by thermal contraction by developing a difference between the temperature of the inserting blocks 17 and 19, and then, through the secondary curing step (step 109b), the resin case 41 is maintained at the predetermined high temperature (175° C. or higher) for a predetermined length of time (4 hours), thereby completely curing the resin case.

In order to prevent the resin case 41 from being warped due to the high temperature during the secondary curing, the resin case 41 is fixed through a pressing jig, and in order to basically suppress the metallic parts from being damaged, the resin case 41 fixed to the pressing jig is charged into the oven, then the predetermined amount of nitrogen gas is introduced into the oven, and then the resin case is secondarily cured at the predetermined temperature for the predetermined length of time.

Figure 18:
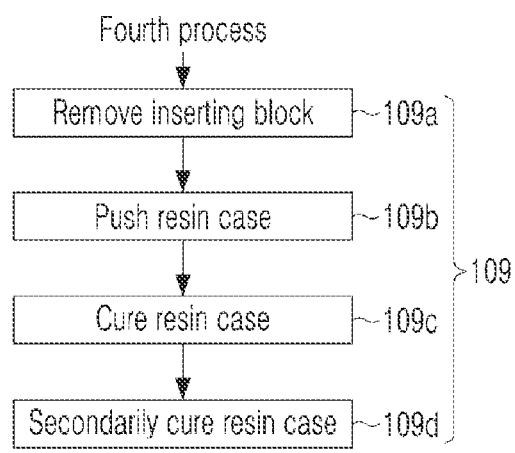
FIG. 18 is a view exemplifying an operation procedure of the fifth process of FIG. 6.

Meanwhile, FIG. 18 is another view exemplifying the operation procedure of the fifth process of FIG. 6. Referring to FIG. 18, the operation procedure of the fifth process will be described with reference to FIG. 18.

First, the fifth process 109: includes, removing the inserting blocks 17 and 19 by thermal contraction by developing a difference between the temperature of the inserting blocks 17 and 19 and the resin case 41 (step 109a); pressing the molded resin case via a pressing member 71 in order to minimize a gap between the molded resin case and the circuit board 11 (step 109b); and completely curing the resin case 41 by maintaining the resin case 41 at a predetermined high temperature for a predetermined length of time (step 109c).

Here, in the curing step (step 109c), in order to prevent the resin case 41 from being warped due to the high temperature during the curing, the resin case 41 is fixed through a pressing jig, and in order to basically suppress the metallic parts from being damaged, the resin case 41 fixed to the pressing jig is charged into the oven, then a predetermined amount of nitrogen gas is introduced into the oven, and then the resin case is cured at the predetermined temperature for the predetermined length of time.

That is, through the inserting block removing step (step 109a), the inserting blocks 17 and 19 are removed from the resin case 41 by thermal contraction by developing a difference between the temperature of the inserting blocks 17 and 19.

Subsequently, in the fifth process 109, through the resin case pressing step (step 109b), the molded resin case is pressed via a pressing member 71 to reduce a gap between the molded resin case and the circuit board 11 (step 109b).

When the resin case 41 is fixed to a predetermined position on a base member of the pressing member and then, the pressing operation member is pressed by a manufacturing worker, the pressing force of the pressing operation member is transferred to a pressing plate and then transferred to the resin case.

Accordingly, the gap between the resin case 41 and the circuit board 11 is reduced due to the force applied to the resin case 41 by the pressing plate.

Subsequently, in the fifth process 109, through the secondary curing step (step 109*c*), the resin case 41 is maintained at the predetermined high temperature (175° C. or higher) for the predetermined length of time (four hours), thereby completely curing the resin case.

That is, in order to prevent the resin case 41 from being warped due to the high temperature during the secondary curing, the resin case 41 is fixed through a pressing jig, and in order to basically suppress the metallic parts from being damaged, the resin case 41 fixed to the pressing jig is charged into the oven, then predetermined amount of nitrogen gas is introduced into the oven, and then the resin case is secondarily cured at the predetermined temperature for the predetermined length of time.

Figure 19:
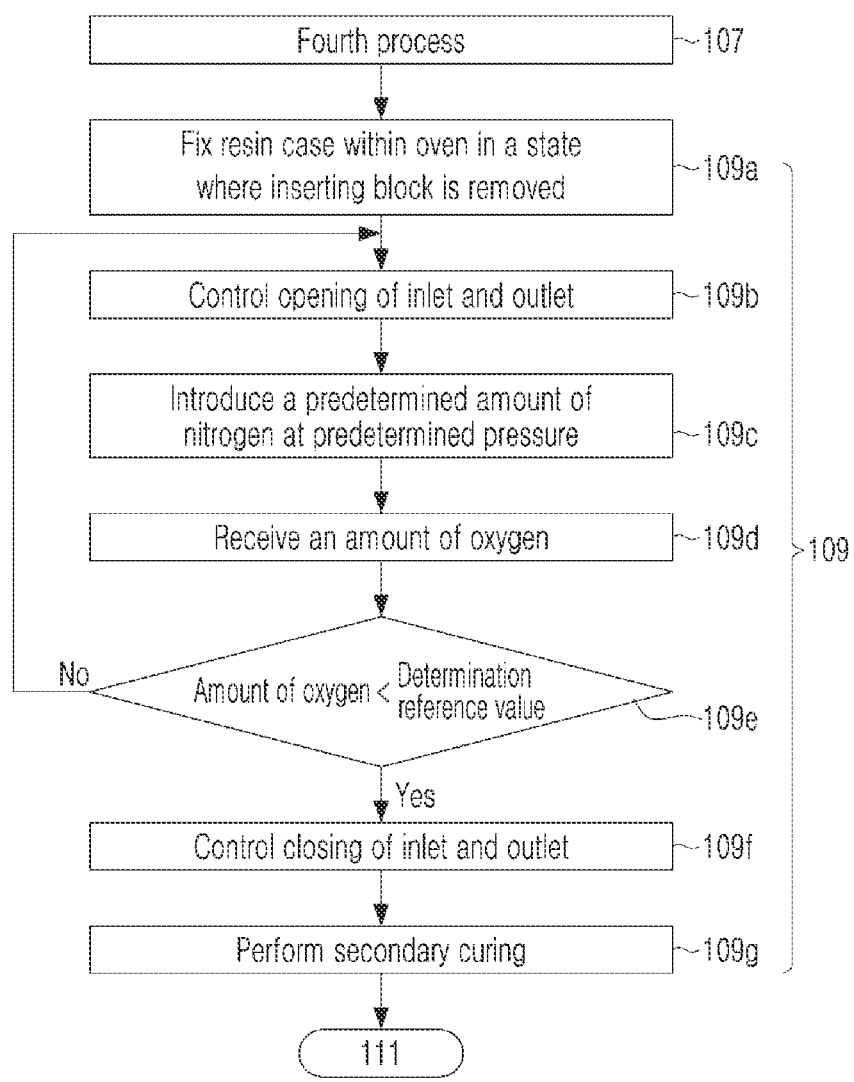
FIG. 19 is a view exemplifying an example of curing a resin case in the fifth process of FIG. 18.

FIG. 19 is a view exemplifying an example of curing a resin case in the fifth process of FIG. 6. Referring to FIG. 19, the procedure of secondarily curing the resin case will be described in more detail with reference to FIG. 19.

That is, in the fifth process 109 for secondary curing the resin case, through step 109*a*, the resin case 41, from which the inserting blocks 17 and 19 have been removed, is fixed to a fixing member 71 within the oven.

Subsequently, in step 109*b*, the inlet and outlet of the oven is controlled to be opened, and in step 109*c*, the predetermined amount of nitrogen is introduced into the oven at a predetermined pressure through the inlet.

At this time, oxygen existing within the oven is discharged to the outside through the outlet by the nitrogen introduced through the inlet at the predetermined pressure.

Meanwhile, in step 109*d*, data indicating the amount of oxygen within the oven supplied from an oxygen sensor installed at a predetermined position within the oven is received, and in step 109*e*, the amount of oxygen indicated by the received data is compared with a predetermined judging reference value.

At this time, as a result of comparison in step 109*e*, when the amount of oxygen is equal to or less than the judging reference value, the inlet and the outlet of the oven are controlled to be closed through step 109*f* and the resin case is cured by maintaining the temperature within the oven at the predetermined temperature at the predetermined length of time through step 109*g*.

That is, since the oxygen existing in the oven is discharged to the outside through the outlet by introducing nitrogen into the oven at the predetermined pressure into the oven, the oxygen existing in the oven is removed. As a result, the discoloration of the cured resin case and the oxidation caused by the oxygen within the oven can be minimized or prevented.

Meanwhile, in the fifth process 109, a resin case process is performed to remove noise components of the resin remaining on the outside of the completely cured resin case.

Figure 20:
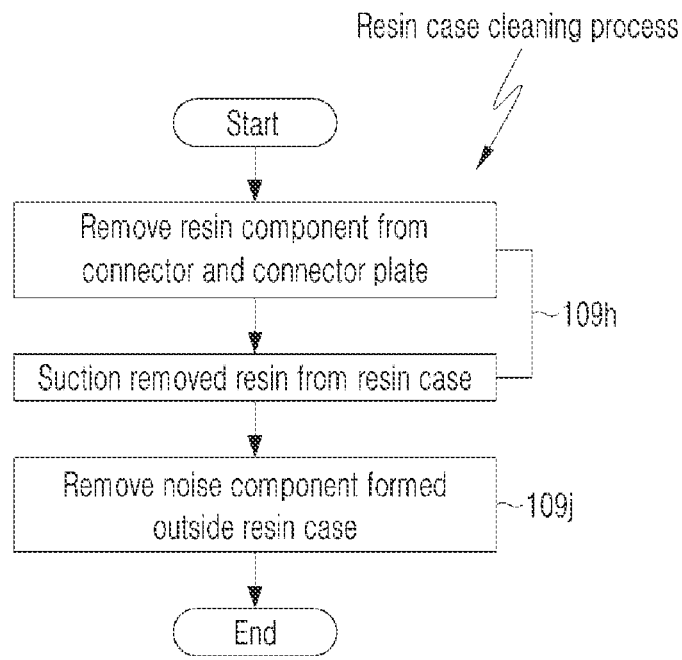
FIG. 20 is a flowchart illustrating a procedure of removing noise formed on the resin case completely cured in the fifth process of FIG. 6.

That is, FIG. 20 illustrates a series of procedures of performing the cleaning process 110 for cleaning the surface of the resin case 41 completely cured after the secondary curing of the resin case which is illustrated in FIG. 19. FIG. 20 is a flowchart illustrating a cleaning process of removing a positive noise component remaining on the outer surface of the resin case 41 completely cured in the fifth process 109 of FIG. 6 and a resin component remaining on a connector and a connector plate exposed to the outside of the resin case 41.

That is, as illustrated in FIG. 20, the resin case cleaning process includes a resin remaining step (step 109*h*) in which carbon dioxide is injected at a predetermined high pressure (50 bar) so as to remove the resin component remaining on a connector and a connector plate exposed to the outside of the resin case 41.

Here, in the resin removing step (step 109*h*), high-pressure carbon dioxide is injected at a pre-set high pressure (50 bar) so as to remove the resin component remaining on a connector and a connector plate exposed to the outside of the resin case 41, and then, the removed resin component is removed from the resin case 41 using vacuum suction device.

In addition, the resin case cleaning process further includes a noise removing step (step 109*j*) in which noise of a positive component remaining on the outside of the resin case is secondarily removed.

Here, in the noise removing step (step 109*j*), a shape of the positive noise is sensed using a sensor and then, the positive noise component is removed through grinding based on a rotation force of a motor which is pre-set based on the shape of the positive noise.

That is, the resin case cleaning process is performed so as to remove the noise component removing on the external appearance of the resin case 41 and the resin component remaining on the connector and the connector plate which are exposed to the outside of the resin case 41.

In the resin removing step (step 109*h*) of the resin case cleaning process, high-pressure carbon dioxide is injected at a pre-set high pressure (50 bar) so as to remove the resin component remaining on a connector and a connector plate exposed to the outside of the resin case 41, and then, the removed resin component is removed from the resin case 41 using a vacuum suction device.

In addition, in the noise removing step (step 109*j*) of the resin case cleaning process, a shape of the positive noise is sensed using a sensor and then, the positive noise component (burr) formed on the external appearance of the resin case 41 is removed through grinding based on a rotation force of a motor which is pre-set based on the shape of the positive noise.

Meanwhile, a spot removing process 110 for removing a spot as illustrated in FIG. 3A is performed on the surface of the cured resin case 41, burr of a negative noise component which is not filled with the resin is subjected to an additional sealing treatment using the resin component as illustrated in FIG. 3B, and a noise removing step 120 is performed in which burr of a positive noise component is formed and then the burr of the positive noise component is removed as illustrated in FIG. 3C.

Figure 21:
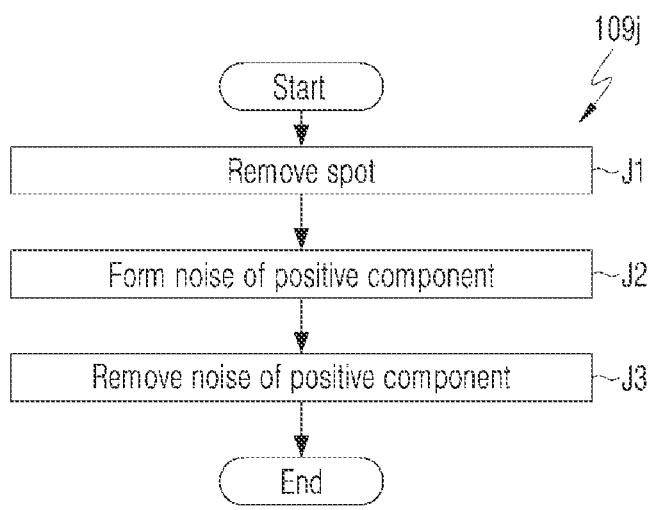
FIG. 21 is a flowchart illustrating a process of removing noise of a negative component and a spot on the resin case cured in the fifth process of FIG. 6.

A series of procedures for removing noise of a negative component and a spot which exist on the surface of the cured resin case in the fifth process 109 will be described in more detail with reference to FIG. 21.

Here, the noise component of the negative component refers to a dent which is not filled with the resin of the resin case cured in the fifth step 109.

Subsequently, further included is a spot removing step (step J1), in which a spot-shaped noise introduced into the resin of the resin case cured in the fifth process 109 is removed by scanning a predetermined amount of laser.

Here, the predetermined amount is a value obtained as a result of performing a plurality of tests. It is apparent to a person skilled in the art that the predetermined amount is variable depending on the size of the spot-shaped noise introduced into the resin case.

For example, the predetermined amount of laser provided when removing a spot of 100 micrometers may have a wavelength of 1064 nanometers and a frequency of 60 Hz. The laser is generated using a current of 3.5 A and a power of 20 W.

In the exemplary embodiment of the present disclosure, it is described as an example that a spot having a size of 100 micrometers or less is removed by scanning a predetermined amount of laser. It is apparent to a person skilled in the art that the size may be sensed through a separate sensor and the spot may be removed using laser having a wavelength and a frequency which correspond to the size of the spot, and thus, detailed descriptions thereof will be omitted.

After performing the spot removing process, a noise removing step for removing a negative noise component is performed. The negative noise removing step includes forming noise of a positive component by sensing a shape of negative noise formed on a surface of the cured resin case using a sensor and then, performing a sealing treatment based on an amount of resin which is pre-set based on the shape of the negative noise (step J2), and removing the noise of the positive component through grinding (step J3).

Here, the noise of the positive component refers to burr which is a positive component protruding to the outside of the cured resin case.

That is, in step J3, a shape of a positive noise is sensed using a sensor and then, a burr which is the noise of the positive component is removed by performing grinding based on a rotation force of a motor which is pre-set based on the shape of the positive noise.

Here, the shape of the positive noise refers to the size of the positive noise which includes the protruding thickness and dimension of the positive noise. At this time, the rotation force of the motor is set based on a proportional relation equation predetermined in relation to the size of the positive noise, and set as a calibration data value for the rotation force of the motor in relation to the size of the positive noise.

After the inserting blocks 17 and 19 are removed from the resin case by thermal contraction by developing a difference between the temperature of the inserting blocks 17 and 19 and the resin case 41 through the above-described procedure in the fifth process 109, the resin case 41 is left under a pre-set temperature for a pre-set length of time to be completely cured. Then, in a sixth process 111, a diagnosis is performed on the antenna members 11a, 11b and 11c.

Figure 22:
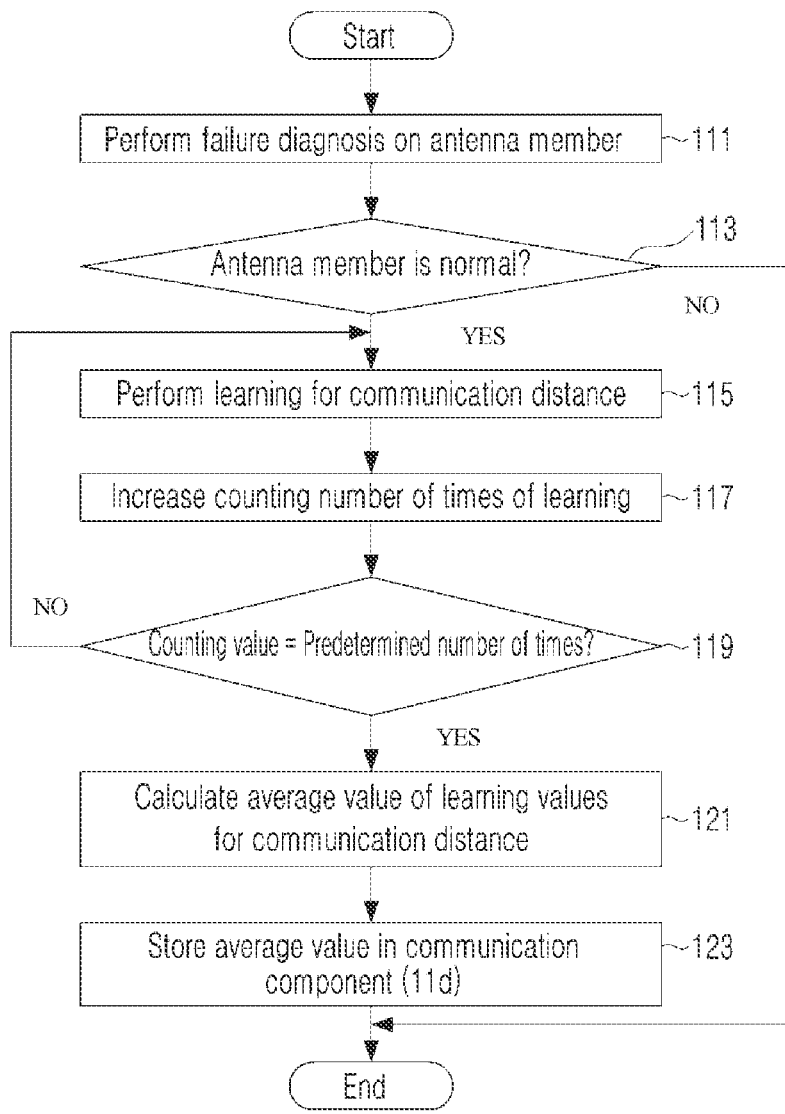
FIG. 22 is a flowchart illustrating a failure diagnosis procedure for an antenna member of FIG. 6.

FIG. 22 illustrates a series of steps of performing a failure diagnosis on the antenna members in the sixth process 110. FIG. 22 is a flowchart illustrating steps of performing the failure diagnosis on the antenna members illustrated in FIG. 1.

That is, the sixth process 110 includes; performing a failure diagnosis on the antenna members 11a, 11b and 11c based on an electromagnetic field strength received after a battery is inserted into the battery accommodation member 13 (step 111), determining whether the antenna members are normal based on a result of performing the failure diagnosis (step 113), performing learning for a communication distance based on the received electromagnetic field strength received when the antenna members are normal in step 113 (step 115), counting the number of times of performing the learning for the communication distance (step 117), determining whether the number of times of performing the learning reaches a predetermined number of times (step 119), calculating an average value for learning values obtained through the learning for the communication distance when the number of times of performing the learning reaches the predetermined number of times (step 121), setting the average value as a calibration data value and storing the calibration data value in the communication component 11d of the circuit board (step 123).

After performing the sixth process 110, a seventh process 130 is additionally performed in which logo and decoration sheets are fixed using double-sided tape.

That is, in the sixth process 110, the failure diagnosis is performed on the antenna members based on the electromagnetic field strength received after inserting the battery into the battery accommodation member 13 so as to perform a communication diagnosis on the antenna members.

That is, after the failure diagnosis is performed on the antenna members based on the electromagnetic field strength received after inserting the battery into the accommodation member 13 in step 111, step 113 is carried out.

Subsequently, in step 113, it is determined whether the antenna members are normal based on the diagnosis result for the antenna members. When it is determined that the antenna members are normal, learning for the communication distance is performed based on the received electromagnetic field strength (step 115).

Then, in step 117, the counting value for the number of times of performing the learning is increased and when the increased counting value reaches the predetermined number of times (step 119), the average value for the learning values obtained through the learning for the communication distance (step 121).

Then, in step 123, the average value is set as a calibration data value and stored in the communication component of the circuit board.

Thereafter, in the sixth process 110, an EOL diagnosis procedure is performed to perform a diagnosis on the wireless transceiver.

That is, the battery and the emergency key are accommodated in the battery accommodation recess 13c and the emergency key accommodation slot 15b, respectively, a button (not illustrated) is accommodated, and then, the diagnosis is finally performed on the wireless transceiver at the end of line (EOL).

A series of steps of finally diagnosing the final wireless transceiver in the EOL process will be described in more detail with reference to FIG. 23.

Figure 23:
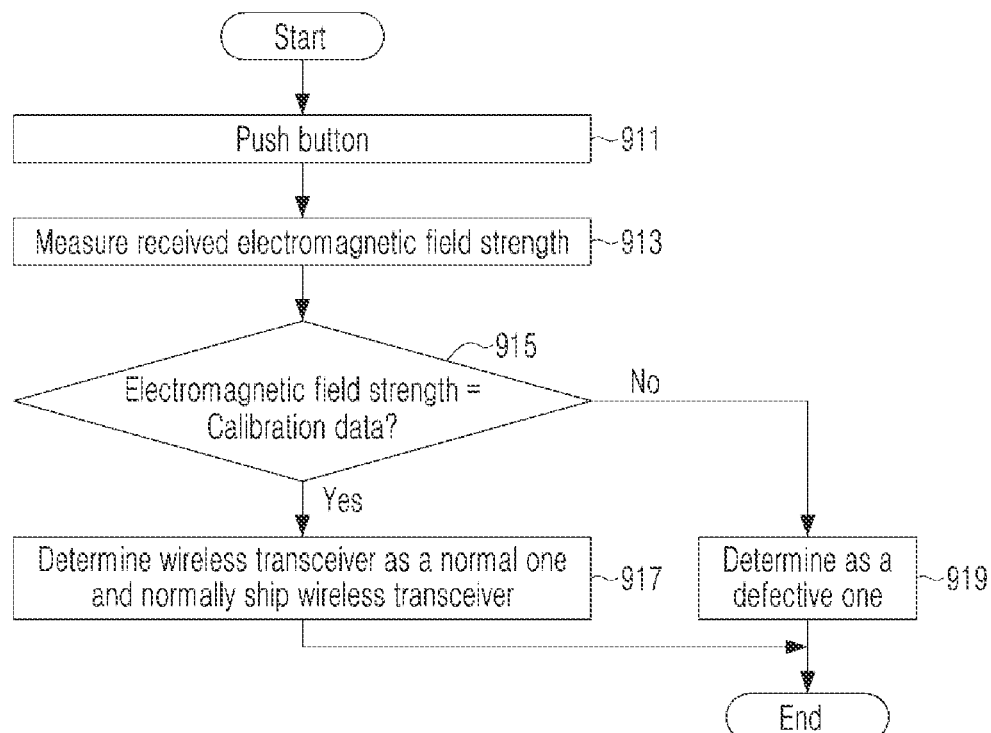
FIG. 23 is a flowchart illustrating an EOL diagnosis procedure of the card type wireless transceiver illustrated in FIG. 6.

FIG. 23 is a flowchart illustrating the EOL diagnosis steps of the card type wireless transceiver illustrated in FIG. 6. The final diagnosis steps of the wireless transceiver in the EOL process will be described with reference to FIG. 23.

First, the electromagnetic field strength received after the start button of the wireless transceiver is pushed is measured, the measured electromagnetic field strength and the electromagnetic field strength previously stored as the calibration data value are compared to each other, and as a result of comparison, when it is determined that the electromagnetic field strengths coincide with each other, the card type wireless transceiver is determined as a normal one and shipped.

That is, in step 911, the button is pushed, and then in step 913, the electromagnetic field is received and the received electromagnetic field strength is measured.

Subsequently, in step 915, the received electromagnetic field strength and the electromagnetic field strength previously stored as the calibration data value are compared to each other.

When the electromagnetic field strengths coincide with each other as the result of comparison in step 915, the card type wireless transceiver is determined as a normal one. Then, decoration and logo sheets are attached to the card type wireless transceiver using double-sided tape and then, the card type wireless transceiver is shipped (step 917).

When the electromagnetic field strengths do not coincide with each other as the result of comparison in step 915, the card type wireless transceiver is determined as a defective one and is discarded (step 919).

Accordingly, a diagnosis for a wireless transceiver as to whether the wireless transceiver is normally operated is performed at an end of line after a resin case, which is configured to completely encapsulate a circuit board mounted with a communication component, a battery accommodation member, and an emergency key accommodation member, is molded and cured and an emergency key and battery are inserted into the resin case. Accordingly, consumers' confidence in products can be further increased by performing a diagnosis on a plurality of products.

Figure 24:
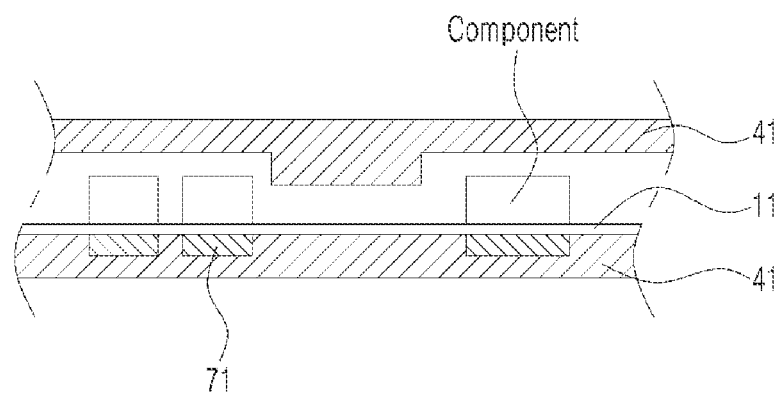
FIG. 24 is a cross-sectional view illustrating diagnosis point illustrated in FIG. 23.

Meanwhile, in a method of manufacturing a card type wireless transceiver according to the present disclosure, in order to repair card type wireless transceivers collected due to a defect after having been shipped, as illustrated in FIG. 24, a diagnosis point is formed by coating solder cream on a rear surface of the circuit board 11 where the components are mounted in the first process 101 and then solidifying the solder cream, and then the fourth process 107 is carried out to form the resin case 41.

Then, when a failure occurs in a card type vehicle wireless transceiver shipped through step 917 illustrated in FIG. 23, a portion of the surface of the resin case corresponding to the position of the solder cream coated and solidified on the circuit board is horizontally grinded or molten with nitric acid so that a part of the circuit board is exposed to the outside. Then, a failure diagnosis for the components embedded in the circuit board is performed on the exposed part of the circuit board using separate diagnosis equipment the exposed part of the circuit board.

Here, the diagnosis equipment may be any of apparatuses capable of sensing the flow of a current of components. Such apparatuses are known in the art and thus, detailed descriptions thereof will be omitted.

According to this configuration, the circuit board 11 in which the components are embedded in the first step 101, the battery terminals 13*a* and 13*b* provided on one side of the circuit board and connected to the circuit board, the battery accommodation member including the battery accommodation recess 13*c*, the reinforcement unit 15*a* provided on the other side of the circuit board 11 and connected with the circuit board 11 through a soldering process, and the emergency key accommodation member having the emergency key accommodation slot 15*b* are individually formed.

Next, in the second process 103, the inserting blocks 17 and 19 are inserted into the battery accommodation recess 13*c* and the emergency key accommodation slot 15*b*, respectively, and then, the third process 105 is carried out.

In the third process 105, interfaces on the surfaces of the molding die 21 and 23 are activate using nitrogen, argon, and hydrogen gas to remove an organic material and then, injector pins 31 and 35 are formed on the inserting blocks 17 and 19 and the bottom side of the circuit board, respectively. Then, the inside of the cavity 25 is maintained in a vacuum state and then, previously patterned molding dies 21 and 23 are installed on the top and bottom sides of the battery accommodation member, the emergency key accommodation member, and the circuit board so as to form cavities 25 which are air spaces are formed between the top side and the rear side of the circuit board 11 and the molding dies 21 and 23, respectively.

Subsequently, in the third process 105, after the molding dies 21 and 23 are installed, a support pin 37 configured to support the circuit board 11 and a positioning pin 39 configured to indicate an installation position of the circuit board 11 are installed at each of the circuit boards.

In addition, in the fourth process 107, an epoxy-based resin is filled in the cavities 25 through a high temperature and high pressure press process so as to mold the resin case 41 configured to encapsulate the left, right, top and bottom sides of the wireless transceiver and then, the fifth process 109 is carried out.

In the fifth process 109, a difference between the temperature of the inserting blocks 17 and 19 and the temperature of the resin case 41 is developed and then the inserting blocks are removed from the resin case due to thermal contraction. Then, the resin case 41 is maintained under a pre-set temperature for a predetermined length of time so as to completely cure the resin case.

After the fifth process 109 is performed, the antenna members 11*a* to 11*c* are diagnosed through the sixth process. After performing the EOL diagnosis, logo and decoration sheets are fixed using double-sided tape (step 131).

As described above, according to the exemplary embodiments of the present disclosure, in a vehicle wireless transceiver manufacturing process according to the present disclosure and a method of manufacturing the same, both of the top and bottom sides of a circuit board, on which components are mounted, are encapsulated using a resin material in a state where the circuit board floats in a cavity. A pin configured to support the circuit board is installed and a decoration flat member is fixed to the surface of the circuit board opposite to the side where the pin is installed using double-sided tape. As a result, it is possible to prevent the resin case from being warped by heat generated from the circuit board. In addition, it is possible to omit an existing post-processing process for preventing the damage to the circuit board which may be caused when one side of the circuit board is exposed to the outside as it is. Thus, steps of the manufacturing process and the manufacturing costs can be reduced.

As described above, those skilled in the art can appreciate that it is possible to implement the present disclosure in other detailed forms without changing the technical idea or the indispensable characteristics of the present disclosure. Therefore, it should be understood that the above-described embodiments are illustrative and are not limiting under any possible interpretation. The scope of the present invention is defined by the appended claims to be described later, rather than the detailed description. Accordingly, it should be appreciated that all modifications or variations derived from the meaning and scope of the appended claims and their equivalents fall within the scope of the present invention.

INDUSTRIAL APPLICABILITY

According to the present disclosure, there is provided a vehicle wireless transceiver manufacturing process according to the present disclosure encapsulates both of the top and bottom sides of a circuit board, on which components are mounted, using a resin material in a state where the circuit board floats in a cavity. A pin configured to support the circuit board is installed and a decoration flat member is fixed to the surface of the circuit board opposite to the side where the pin is installed using double-sided tape. As a result, it is possible to prevent, the resin case from being warped by heat generated from the circuit board. In addition, it is possible to omit a post-processing process which has been performed in an existing manufacturing process in order to prevent the damage to the circuit board which may be caused when one side of the circuit board. Thus, steps of the manufacturing process can be reduced and the manufacturing costs can be reduced. As a result, considerable improvements can be achieved in terms of accuracy and confidence in operating a vehicle wireless transceiver manufacturing method and in terms of performance efficiency. Further, the card type wireless transceiver for a vehicle is sufficiently valuable to market and sell and apparently embodied. Consequently, the present disclosure has industrial applicability.

What is claimed is:

1. A wireless transceiver for a vehicle which is configured to execute authentication for a driver and a vehicle through short-distance communication with an immobilizer installed inside the vehicle and configured to control the vehicle based on a result of authentication, the transceiver comprising:
   a circuit board which is embedded with a component configured to execute communication with the immobilizer;
   a battery accommodation member installed on one side of the circuit board, and including a battery terminal connected to the circuit board; and
   an emergency key accommodation device having a reinforce unit installed on the other side of the circuit board and connected to the circuit board through a soldering process, the emergency key accommodation device being inserted into a resin case which is molded using one resin component, wherein the emergency key accommodation device includes:
   an emergency key accommodation member housed within a body of the wireless transceiver to accommodate the emergency key; and
   a switching member installed at one side of the body to prevent removal of the emergency key accommodated in the emergency key accommodation member, wherein the switching member includes:
   a switch configured to allow the user to select the removal or insertion of the emergency key in relation to the inside of the emergency key accommodation member through the user's leftward or rightward manipulation;
   an elastic unit installed on one side of the switch to generate or restore elastic force depending on the leftward or rightward manipulation of the switch; and
   a latching step provided on the other side of the switch so as to allow the emergency key to be accommodated in the reinforce unit when the emergency key is moved toward and accommodated in the emergency key accommodation member by the elastic force of the elastic unit,
   wherein the emergency key includes a latching recess which is provided on a position corresponding to the latching step and is fixedly latched to the latching step of the switching member so as to maintain the accommodated state of the emergency key.

2. A wireless transceiver for a vehicle which is configured to execute authentication for a driver and a vehicle through short-distance communication with an immobilizer installed inside the vehicle and configured to control the vehicle based on a result of authentication, the transceiver comprising:
   a circuit board which is embedded with a component configured to execute communication with the immobilizer;
   a battery accommodation member installed on one side of the circuit board, and including a battery terminal connected to the circuit board; and
   an emergency key accommodation device having a reinforce unit installed on the other side of the circuit board and connected to the circuit board through a soldering process, the emergency key accommodation device being inserted into a resin case which is molded using one resin component, wherein the emergency key accommodation device includes:
   an emergency key accommodation member housed within a body of the wireless transceiver to accommodate the emergency key; and
   a switching member installed at one side of the body to prevent removal of the emergency key accommodated in the emergency key accommodation member.

3. The wireless transceiver of claim 2, wherein the emergency key and the emergency key accommodation member are provided in a "⌐┘" shape.

4. The wireless transceiver of claim 3, wherein the reinforcement unit is formed of a rigid stainless steel so as to protect the body from damage which is caused due to frequent removal and insertion operations of the emergency key.

5. The wireless transceiver of claim 2, wherein the emergency key accommodation member includes:
   an emergency key accommodation slot provided in the body so that the emergency key is inserted into the emergency key accommodation slot; and
   the reinforcement unit configured to fix the emergency key to top, bottom, left and right walls of the body.

6. The wireless transceiver of claim 2, wherein the emergency key accommodation member is fixedly installed through the soldering process on the upper side of the circuit board fixedly installed inside the body of the wireless transceiver.

7. The wireless of claim 2, wherein the switching member is installed on one side of the emergency key accommodation member of the body and provided to prevent the insertion or removal of the emergency key in relation to the inside of the emergency key accommodation member according to the user's leftward or rightward moving manipulation state.

8. The wireless transceiver of claim 2, wherein the switching member includes:
   a switch configured to allow the user to select the removal or insertion of the emergency key in relation to the inside of the emergency key accommodation member through the user's leftward or rightward manipulation;
   an elastic unit installed on one side of the switch to generate or restore elastic force depending on the leftward or rightward manipulation of the switch; and
   a latching step provided on the other side of the switch so as to allow the emergency key to be accommodated in the reinforce unit when the emergency key is moved toward and accommodated in the emergency key accommodation member by the elastic force of the elastic unit,
   wherein the emergency key includes a latching recess which is provided on a position corresponding to the latching step and is fixedly latched to the latching step of the switching member so as to maintain the accommodated state of the emergency key.

9. A method of manufacturing a wireless transceiver, the method comprising:
   a first process of forming a circuit board embedded with a component configured to perform data communication inside a vehicle, a battery accommodation member mounted on one side of the circuit board and including a battery terminal connected to the circuit board, a reinforcement unit mounted on the other side of the circuit board and connected with the circuit board through a soldering process, and an emergency key accommodation member having an emergency key that accommodates the accommodation slot;

a second process of inserting an inserting block into each of a battery accommodation recess of the battery accommodation member and an emergency key accommodation slot of the emergency key accommodation member;

a third process of installing previously patterned molding dies on top and bottom sides of the accommodation member, the emergency key accommodation member, and the circuit board so as to form cavities (air spaces) on top side and rear side of the circuit board with the molding dies;

a fourth process of filling an epoxy-based resin in the cavities through a high-temperature and high-pressure press process so as to form a resin case configured to encapsulate the left, right, top and bottom surfaces of the wireless transceiver and then primarily curing the resin case; and a fifth process of removing the inserting blocks from the molding dies and then secondarily curing the resin case.

10. The method of claim 9, the method further comprising:

forming an antenna coil unit configured to data transmitted from the vehicle through low frequency communication on the circuit board, wherein a coil is wound around a bobbin and an output end and an input end of the coil are connected to corresponding pins of an micro control unit so as to perform data communication with the vehicle in X and Y directions; and forming an antenna pattern portion by etching a metallic copper foil layer of the circuit board in a predetermined pattern in order to transmit/receive data with the vehicle in a Z direction.

11. The method of claim 10, wherein the forming of the antenna coil unit includes:

winding the coil having a diameter which is equal to or less than a predetermined value on the bobbin which has a through-hole into which a rod-shaped core formed of a magnetic material;

forming a connection portion extending along a longitudinal direction of the core from the bobbin and fixed to the bobbin and then connecting one terminal of the coil and the connection portion by soldering;

fixedly installing a bottom surface of the bobbin around which the coil is wound and a bottom of the connection portion on predetermined positions on the circuit board through a soldering process and electrically connecting the coil to the circuit board through the connection portion; and forming a resonance circuit by connecting a capacitor to a predetermined position on the circuit board through a soldering process so that the capacitor and the coil are electrically connected with each other.

12. The method of claim 11, wherein the antenna is set to have a length in a range of 8.4 mm to 11.0 mm, a width in a range of 2.0 mm±0.03 mm, and a thickness of 1.3 mm.

13. The method of claim 9, wherein the first process further includes:

forming an anchor hole in a remaining area other than a position where the component configured to receive data transmitted from the vehicle through low frequency communication, the anchor hole being larger than a via hole configured by a conductive material for electrical connection between circuit board layers.

14. The method of claim 9, wherein the second step further comprises:

cleaning the circuit board after an inserting is inserted, wherein the cleaning of the circuit board comprises:

a first cleaning step of performing a plasma process based on a predetermined amount of hydrogen and a pre-set current to cause a chemical reaction between the hydrogen and an organic material so as to remove the organic material from a surface of a component on the circuit board.

15. The method of claim 9, wherein the third process further includes:

installing a predetermined number of injector pins configured to remove the inserting blocks from the molding dies at predetermined positions on the top and bottom surfaces of the inserting blocks, respectively; and installing a predetermined number of injector pins configured to remove the inserting blocks from the molding dies at predetermined positions on the bottom surface of the circuit board.

16. The method of claim 9, wherein the third process further includes:

installing a predetermined number of support pins configured to support the circuit board at predetermined positions on the top surface of the circuit board after the molding dies are installed.

17. The method of claim 9, wherein the fourth process includes:

maintaining the inside of the cavity in a vacuum state; and filling a thermosetting resin in the inside of the cavity through a plunger by performing a high pressure and high temperature press process.

18. The method of claim 9, wherein the fifth process includes:

removing the inserting blocks by thermal contraction by developing a difference between a temperature of the inserting blocks and a temperature of the resin case; and completely curing the resin case by maintaining the resin case under a pre-set high temperature for a predetermined length of time.

19. The method of claim 9, wherein, in the fifth process, secondary curing is performed after the resin case is fixed to a fixing member installed within the oven in a state where the inserting blocks are removed from the molding dies, and oxygen existing within the oven is removed fixing member installed within the oven.

20. The method of claim 9, further comprising:

forming a diagnosis point by coating solder cream on a surface of the circuit board which is opposite to the surface of the circuit board where the components are mounted in the first process, and then, solidifying the solder cream under a high temperature.

* * * * *